United States Patent
Bae et al.

(10) Patent No.: US 9,502,643 B2
(45) Date of Patent: Nov. 22, 2016

(54) SEMICONDUCTOR DEVICE, MAGNETIC MEMORY DEVICE, AND METHOD OF FABRICATING THE SAME

(71) Applicants: Byoungjae Bae, Hwaseong-si (KR); Jongchul Park, Seongnam-si (KR); Shin Kwon, Yongin-si (KR); Inho Kim, Suwon-si (KR); Changwoo Sun, Hwaseong-si (KR)

(72) Inventors: Byoungjae Bae, Hwaseong-si (KR); Jongchul Park, Seongnam-si (KR); Shin Kwon, Yongin-si (KR); Inho Kim, Suwon-si (KR); Changwoo Sun, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/606,157

(22) Filed: Jan. 27, 2015

(65) Prior Publication Data

US 2015/0311433 A1    Oct. 29, 2015

(30) Foreign Application Priority Data

Apr. 28, 2014    (KR) .................. 10-2014-0050867

(51) Int. Cl.
| | | |
|---|---|---|
| H01L 43/12 | (2006.01) | |
| H01L 43/08 | (2006.01) | |
| H01L 27/22 | (2006.01) | |

(52) U.S. Cl.
CPC ............. *H01L 43/12* (2013.01); *H01L 27/228* (2013.01); *H01L 43/08* (2013.01)

(58) Field of Classification Search
CPC ...... H01L 43/12; H01L 27/222; H01L 43/08
See application file for complete search history.

(56) References Cited

U.S. PATENT DOCUMENTS

| | | |
|---|---|---|
| 6,391,658 B1 | 5/2002 | Gates et al. |
| 6,822,278 B1 | 11/2004 | Koutny |
| 7,045,368 B2 | 5/2006 | Hong et al. |
| 7,932,513 B2 | 4/2011 | Hosotani et al. |
| 2010/0193888 A1 | 8/2010 | Gu et al. |
| 2011/0121417 A1 | 5/2011 | Li et al. |
| 2012/0135544 A1 | 5/2012 | Kim et al. |
| 2012/0326252 A1 | 12/2012 | Yamakawa et al. |
| 2014/0151777 A1* | 6/2014 | Sim .................. H01L 29/42324 257/315 |
| 2014/0225251 A1* | 8/2014 | Lee ........................ H01L 23/28 257/734 |

FOREIGN PATENT DOCUMENTS

KR    2003-0078136 A    10/2003

* cited by examiner

*Primary Examiner* — Fernando L Toledo
*Assistant Examiner* — Valerie N Newton
(74) *Attorney, Agent, or Firm* — Lee & Morse P.C.

(57) ABSTRACT

A method of fabricating a semiconductor device includes forming conductive pillars on a substrate, sequentially forming a sacrificial layer and a molding structure between the conductive pillars, forming a conductive layer on the molding structure, such that the conductive layer is connected to the conductive pillars, removing the sacrificial layer to form an air gap, removing the molding structure to form an expanded air gap, and patterning the conductive layer to open the expanded air gap.

20 Claims, 29 Drawing Sheets

SEMICONDUCTOR DEVICE, MAGNETIC MEMORY DEVICE, AND METHOD OF FABRICATING THE SAME

CROSS-REFERENCE TO RELATED APPLICATION

Korean Patent Application No. 10-2014-0050867, filed on Apr. 28, 2014, in the Korean Intellectual Property Office, and entitled: "Semiconductor Device, Magnetic Memory Device, and Method of Fabricating the Same," is incorporated by reference herein in its entirety.

BACKGROUND

1. Field

Example embodiments relate to a magnetic memory device, and in particular, to a fabrication method including pattering a plurality of conductive layers and semiconductor and magnetic memory devices fabricated thereby.

2. Description of the Related Art

Due to the increased demand for electronic devices with a high speed and/or a low power consumption, the semiconductor device requires a fast read/write operating speed and/or a low operating voltage. A magnetic memory device has been suggested to satisfy such technical requirements. For example, the magnetic memory device can provide technical advantages, such as low latency and non-volatility. As a result, the magnetic memory device is being regarded as an emerging next-generation memory device.

Further, other next-generation semiconductor memory devices, e.g., a ferroelectric random access memory (FRAM), a magnetic random access memory (MRAM) and a phase change random access memory (PRAM), are also being developed to satisfy the technical requirements. In the next generation semiconductor memory devices, an electric resistance of a memory element can be changed using a current or voltage applied thereto and can be maintained even when an electric power is interrupted

SUMMARY

Example embodiments provide a method capable of reducing a re-deposition phenomenon of etch residues, which may occur when a conductive layer is patterned. Other example embodiments of the inventive concept provide a method capable of preventing an electric short between conductive layers caused by the re-deposition of the etch residues.

According to example embodiments, a method of fabricating a semiconductor device may include forming conductive pillars on a substrate, sequentially forming a sacrificial layer and a molding structure between the conductive pillars, forming a conductive layer on the molding structure, such that the conductive layer is connected to the conductive pillars, removing the sacrificial layer to form an air gap, removing the molding structure to form an expanded air gap, and patterning the conductive layer to open the expanded air gap.

In example embodiments, the substrate may include a cell array region and a peripheral circuit region, and the removing of the molding structure may be performed through a pathway that is located between the cell array region and the peripheral circuit region.

In example embodiments, the cell array region may have first to fourth edges adjacent to the peripheral circuit region, and the pathway may be formed to cross at least one of the first to fourth edges.

In example embodiments, the removing of the molding structure may be performed after the forming of the conductive layer.

In example embodiments, the removing of the molding structure may include forming a mask pattern to cover the cell array region and expose the peripheral circuit region, performing a patterning process using the mask pattern as an etch mask to expose a sidewall of the molding structure, and etching the molding structure exposed by the patterning process.

In example embodiments, the removing of the sacrificial layer may be performed after the forming of the conductive layer and after the patterning process. The patterning process is performed to expose the sacrificial layer. The etching of the molding structure may be performed after the removing of the sacrificial layer.

In example embodiments, the patterning process may be performed to expose a sidewall of the conductive layer, and the method may further include forming a spacer insulating layer on the sidewall of the conductive layer exposed by the patterning process to seal the air gap, after the removing of the sacrificial layer.

In example embodiments, the patterning process may be performed to expose a sidewall of the conductive layer, and the method may further include performing a thermal oxidation process to form a capping oxide layer on the exposed sidewall of the conductive layer, before the removing of the sacrificial layer.

In example embodiments, the removing of the sacrificial layer may be performed before the forming of the conductive layer, the removing of the molding structure may be performed after the removing of the sacrificial layer, and the patterning process may be performed to open the air gap.

In example embodiments, the forming of the molding structure may include forming first molding patterns on upper sidewalls of the conductive pillars, and the sacrificial layer may be removed through gap regions between the first molding patterns.

In example embodiments, the first molding patterns may be formed using a spacer process to have a ring-shaped structure enclosing the upper sidewall of the conductive pillar, when viewed in a plan view.

In example embodiments, the first molding patterns may be formed to have penetrating holes exposing the sacrificial layer.

In example embodiments, the conductive layer may include a lower electrode layer and a magnetic tunnel junction layer on the lower electrode layer, the lower electrode layer may be formed before the removing of the molding structure, and the magnetic tunnel junction layer may be formed after the removing of the molding structure.

According to other example embodiments, a method of fabricating a magnetic memory device may include preparing a substrate with a cell array region and a peripheral circuit region, forming conductive pillars on the cell array region, sequentially forming a sacrificial layer and a molding structure on the conductive pillars, forming a conductive layer on the molding structure, removing the sacrificial layer to form an air gap between the conductive pillars, performing a first patterning process using a mask pattern covering the cell array region and exposing the peripheral circuit region to expose the molding structure, removing the molding structure exposed through a boundary between the cell array region and the peripheral circuit region to form an expanded air gap, and performing a second patterning process on the conductive layer to open the expanded air gap.

In example embodiments, the first patterning process may be performed to expose the sacrificial layer, and the removing of the sacrificial layer may be performed through a pathway that is located between the cell array region and the peripheral circuit region, after the first patterning process.

In example embodiments, the first patterning process may be performed to expose a sidewall of the conductive layer, and the method may further include performing a thermal oxidation process to form a capping oxide layer on the exposed sidewall of the conductive layer.

In example embodiments, the first patterning process may be performed to expose a sidewall of the conductive layer, and the method may further include forming a spacer insulating layer to seal the air gap, before the removing of the molding structure.

In example embodiments, the removing of the sacrificial layer may be performed before the forming of the conductive layer, the removing of the molding structure may be performed after the removing of the sacrificial layer, and the first patterning process may be performed to open the air gap.

In example embodiments, the forming of the molding structure may include forming first molding patterns on upper sidewalls of the conductive pillars, and the sacrificial layer may be removed through gap regions between the first molding patterns.

In example embodiments, the first molding patterns may be formed using a spacer process to have a ring-shaped structure enclosing the upper sidewall of the conductive pillar, when viewed in a plan view.

In example embodiments, the method may further include forming a second molding pattern to fill the gap regions between the first molding patterns, after the removing of the sacrificial layer.

In example embodiments, the first molding patterns may be formed to have penetrating holes exposing the sacrificial layer.

In example embodiments, the forming of the conductive layer may include sequentially forming a lower electrode layer and a magnetic tunnel junction layer on the molding structure, the lower electrode layer may be formed before the removing of the molding structure, and the magnetic tunnel junction layer may be formed after the removing of the molding structure.

In example embodiments, the method may further include forming a capping insulating layer to cover sidewalls of the conductive pillars, before the forming of the sacrificial layer.

In example embodiments, the molding structure may be formed of a material having an etch selectivity with reference to the sacrificial layer.

In example embodiments, the method may further include forming contacts to connect the conductive pillars to the substrate, and forming conductive pads between the conductive pillars and the contacts.

According to other example embodiments, a method of fabricating a semiconductor device may include forming conductive pillars on a substrate, sequentially forming a sacrificial layer and a molding structure between the conductive pillars, forming a conductive layer on the molding structure, such that the conductive layer is connected to the conductive pillars, removing the sacrificial layer, such that an air gap is formed between adjacent conductive pillars, removing the molding structure, such that an expanded air gap is formed between the adjacent conductive pillars, and patterning the conductive layer to form conductive patterns on respective conductive pillars, such that a space between the conductive patterns is in fluid communication with the expanded air gap.

Removing the sacrificial layer may include exposing a portion of a surface of the sacrificial layer, and removing the sacrificial layer through the exposed surface, such that the air gap is defined between the adjacent conductive pillars along a first direction, and between the molding structure and the substrate along a second direction.

Forming the conductive layer may include sequentially forming a lower electrode layer and a magnetic tunnel junction layer on the molding structure, the lower electrode layer may be formed before removing the molding structure, and the magnetic tunnel junction layer may be formed after removing the molding structure.

Patterning the conductive layer may include forming magnetic tunnel junction patterns separated from each other, such that etch residue from the patterning is deposited in a bottom of the expanded air gap.

The fluid communication between the expanded air gap and the space between the conductive patterns may be formed before completion of patterning of the conductive layer into the conductive patterns.

According to other example embodiments, a magnetic memory device may include contacts connected to a substrate, conductive pillars on the contacts, magnetic tunnel junction structures on the conductive pillars, a capping insulating layer provided between the conductive pillars to cover sidewalls of the conductive pillars, a protection insulating layer provided on sidewalls of the magnetic tunnel junction structures and extended to cover the capping insulating layer, and a conductive etch residue layer interposed between the capping insulating layer and the protection insulating layer.

In example embodiments, the substrate may include a cell array region and a peripheral circuit region, and the magnetic memory device may further include a remaining spacer insulating layer provided on a boundary between the cell array region and the peripheral circuit region to have a bottom surface higher than bottom surfaces of the conductive pillars and a top surface lower than top surfaces of the conductive pillars.

In example embodiments, the remaining spacer insulating layer may include silicon nitride.

In example embodiments, the remaining spacer insulating layer extends along the boundary between the cell array region and the peripheral circuit region.

In example embodiments, the magnetic memory device may further include lower electrode patterns between the conductive pillars and the magnetic tunnel junction structures. The capping insulating layer may be in direct contact with bottom surfaces of the lower electrode patterns.

In example embodiments, the magnetic memory device may further include conductive pads disposed between the contacts and the conductive pillars.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
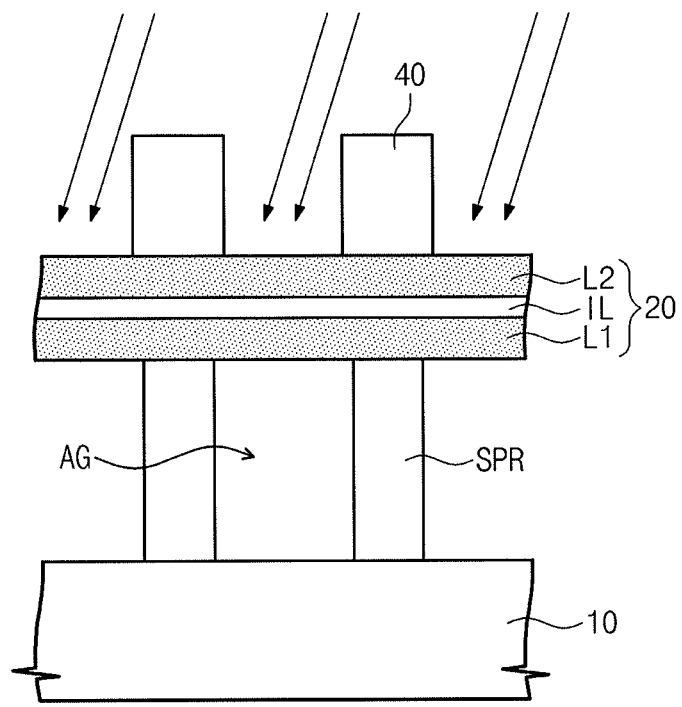
FIGS. 1 through 3 illustrate schematic cross-sectional views of a method of fabricating a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, it should be noted that the drawing figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

It will also be understood that when an element is referred to as being "on" another element or substrate, it can be directly on the other element or substrate, or intervening elements may also be present. Further, it will also be understood that when an element is referred to as being "between" two elements, it can be the only element between the two elements, or one or more intervening elements may also be present. In addition, it will be understood that when an element is referred to as being "connected" or "coupled" to another element, it can be directly coupled or connected, or one or more intervening elements may also be present. In contrast, when an element is referred to as being "directly connected," "directly coupled", etc. to another element, there are no intervening elements present. Other words used to describe the relationship between elements or layers should be interpreted in a like fashion (e.g., "between" versus "directly between," "adjacent" versus "directly adjacent," etc.). Like reference numerals refer to like elements throughout.

As used herein the teem "and/or" includes any and all combinations of one or more of the associated listed items. Further, it will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art to. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
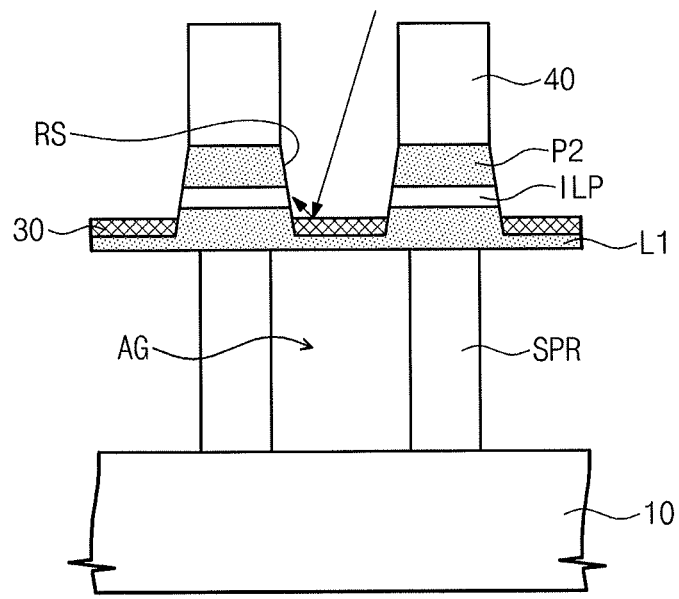
Figure 3:
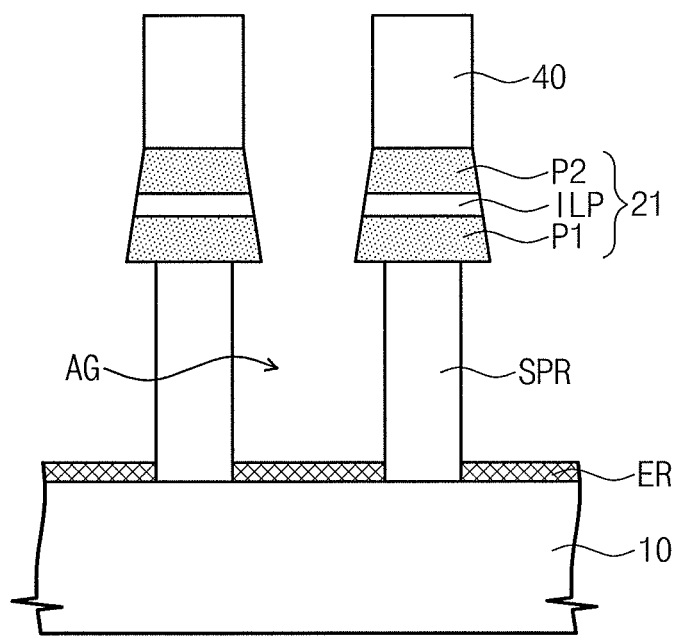

FIGS. 1 through 3 are cross-sectional views schematically illustrating stages in a method of fabricating a semiconductor device according to example embodiments.

Referring to FIG. 1, a conductive layer 20 may be provided on a substrate 10. The substrate 10 may be configured to include a selection device, e.g., a transistor or a diode. Conductive pillars SPR may be provided between the conductive layer 20 and the substrate 10, and an air gap AG, e.g., an empty space, may be provided between the conductive pillars SPR. For example, the air gap AG may be defined by side surfaces of the conductive pillars SPR, a top surface of the substrate 10, and a bottom surface of the conductive layer 20. The conductive pillars SPR may be two-dimensionally arranged on the substrate 10. The conductive layer 20 may include a lower conductive layer L1, an upper conductive layer L2, and an insulating layer IL between the lower and upper conductive layers L1 and L2.

Mask patterns 40 may be provided on the conductive layer 20, and then, a patterning process using the mask patterns 40 as an etch mask may be performed on the conductive layer 20. For example, the conductive layer 20 may be patterned using a sputtering process, i.e., a sputter etching process.

FIG. 2 shows a middle stage of the patterning process, in which the conductive layer 20 is partially etched. FIG. 3 shows a final stage of the patterning process, in which the conductive layer 20 is patterned into a plurality of conductive patterns 21 separated from each other.

In other words, as shown in FIGS. 2 and 3, the conductive layer 20 may be patterned into the conductive patterns 21 separated from each other. As illustrated in FIG. 3, each of the conductive patterns 21 may include a lower conductive pattern P1, an insulating pattern ILP, and an upper conductive pattern P2. The lower and upper conductive patterns P1 and P2 may be electrically separated from each other by the insulating pattern ILP interposed therebetween.

Referring back to FIG. 2, in the middle stage of the patterning process, a recess region RS may be formed in the conductive layer 20. Etch residue 30 (for example, by-products of the sputtering process) may be formed on a bottom of the recess region RS. As the sputtering process continues, conductive elements in the etch residue 30 may be re-sputtered to cover a sidewall of the recess region RS (for example, on a sidewall of an etched region of the conductive layer 20).

As illustrated in FIG. 3, when the sputtering process continues, the recess region RS may penetrate the conductive layer 20 and may be connected to the air gap AG. In other words, the sputtering process continues to separate the conductive layer 20 into completely distinct conductive patterns 21 separated from each other by a space, so the space between the conductive patterns 21 is in fluid communication with the air gap AG. In this case, the etch residue 30, which was on sidewall and bottom of the recess region RS, may fall to a bottom of the air gap AG (for example, to the top surface of the substrate 10) and form an etch residue layer ER.

In general, an amount of the conductive elements, which are re-sputtered and re-deposited on the sidewalls of the conductive patterns 21, may vary depending on a height of the bottom surface of the recess region RS. For example, since at an initial stage of the patterning process the bottom surface of the recess region RS is positioned in the conductive layer 20, most of the re-deposited conductive elements adhere to the sidewalls of the conductive patterns 21. The re-deposited conductive elements may include a metallic material and may have a saturated vapor pressure lower than a silicon layer or an insulating layer.

Accordingly, if there had been no air gap below the conductive layer 20, in order to remove the re-deposited conductive elements and lower a level of the bottom surface of the recess region RS, the sputtering process would have to continue for a longer time, i.e., an additional process time, even when the formation of the conductive patterns 21 is finished. Further, if there had been no air gap below the conductive layer 20, it would have been difficult to lower the level of the bottom surface of the recess region RS even with the additional sputtering process. Also, the additional sputtering process may require an additional process time, thereby changing a shape of the underlying structure. In addition, the additional sputtering process may lead to an increase in a consumption amount of the mask patterns 40.

However, according to example embodiments, since the air gap AG is formed below the conductive layer 20, it is possible to reduce the level of the bottom surface of the recess region RS without an additional sputtering process. That is, in the case where the recess region RS is connected to the air gap AG through the conductive layer 20, the etch residue layer ER may be formed on the bottom of the air gap AG (for example, on the top surface of the substrate 10) that is vertically spaced apart from the conductive layer 20. Accordingly, it is possible to reduce the amount of the conductive elements, which are re-sputtered and re-deposited on the sidewalls of the conductive patterns 21, and consequently, to prevent an electric short between the lower and upper conductive patterns P1 and P2. Further, it is possible to suppress an increase in widths of the conductive patterns 21 caused by the re-sputtering process, and thus, an electric short between adjacent ones of the conductive patterns 21 can be prevented. In addition, since the additional sputtering process is not required, it is possible to reduce consumption of the mask patterns 40.

Figure 4:
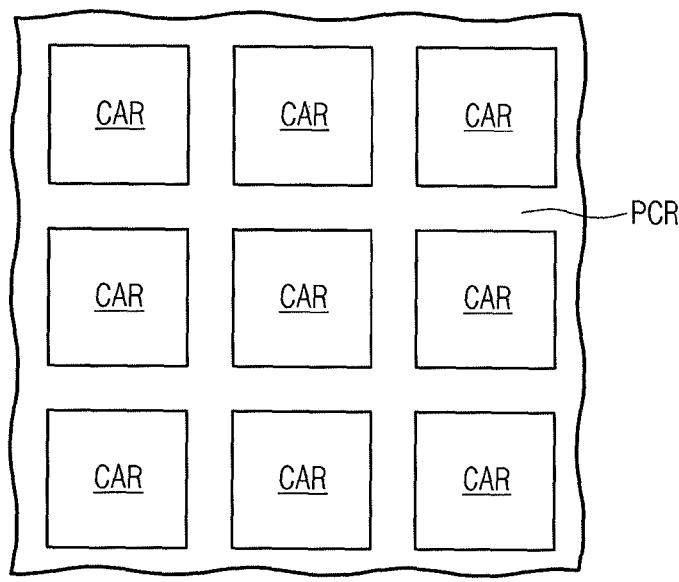
FIG. 4 illustrates a plan view of a magnetic memory device according to example embodiments.
Figure 5:
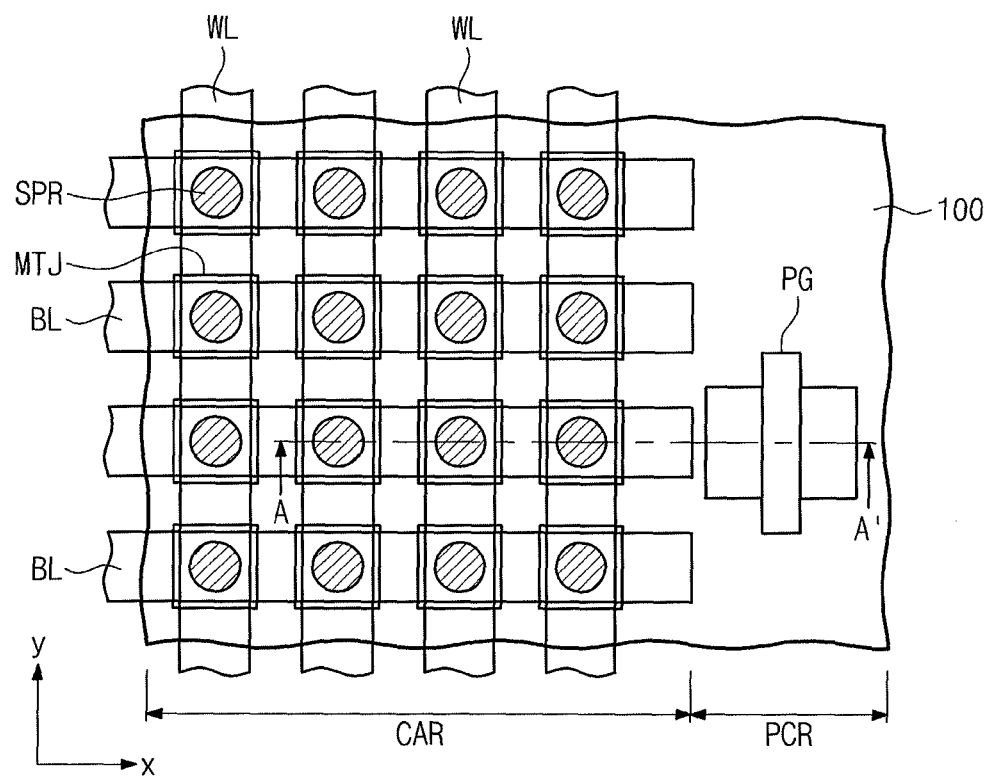
FIG. 5 illustrates an enlarged view of a cell array region and a peripheral circuit region of FIG. 4.

FIG. 4 is a plan view of a magnetic memory device according to example embodiments. FIG. 5 is an enlarged view of a cell array region and a peripheral circuit region of FIG. 4. FIGS. 6 through 14 are sectional views along line A-A' of FIG. 5, which illustrate stages in a method of fabricating a magnetic memory device according to example embodiments.

Figure 6:
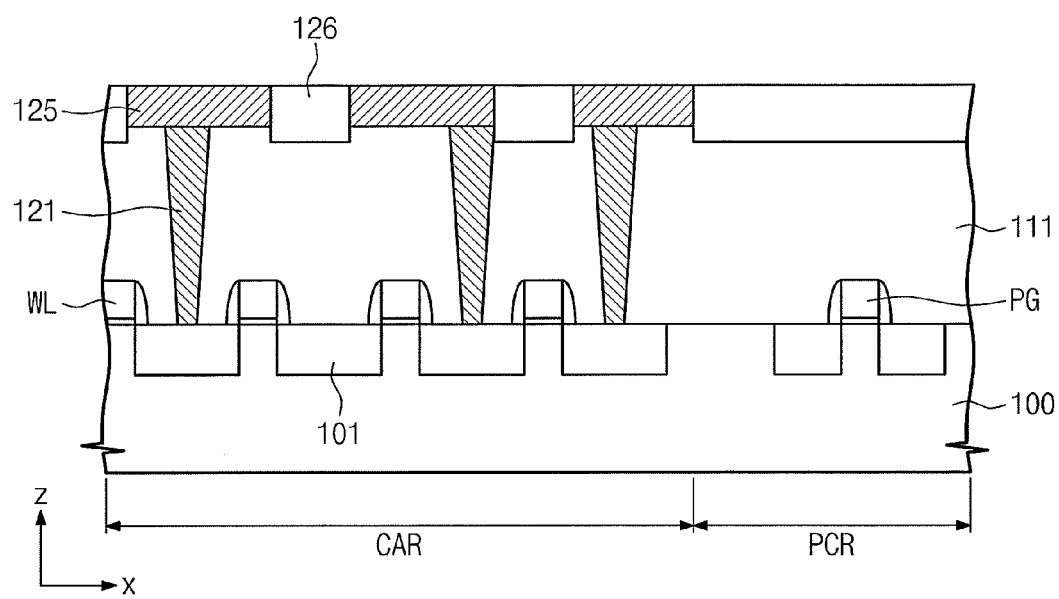
FIGS. 6 through 14 are cross-sectional views along line A-A' of FIG. 5, which illustrate stages in a method of fabricating a magnetic memory device according to example embodiments.

Referring to FIGS. 4 through 6, a substrate 100 with cell array regions CAR and a peripheral circuit region PCR may be provided. Memory cells may be provided on each of the cell array regions CAR, and transistors for operating the memory cells may be provided on the peripheral circuit region PCR. The description that follows will refer to one cell array region CAR and one peripheral circuit region PCR adjacent thereto, but example embodiments are be limited thereto. Further, for simplicity, the description that follows will refer to a magnetic memory device, but example embodiments are be limited thereto.

Referring to FIGS. 5-6, selection devices may be formed on the cell array region CAR of the substrate 100. The selection devices may be, e.g., transistors. For example, word lines WL serving as gate electrodes of the transistors may be formed on the substrate 100, and source/drain regions 101 (FIG. 6) serving as source/drain electrodes of the transistors may be formed in the substrate 100 between the word lines WL. The word lines WL may be arranged along a first direction, e.g., along an x direction, and may extend in a second direction, e.g., along a y direction, crossing the first direction. Each of the word lines WL may include a gate electrode and a gate dielectric layer. As an example, the gate electrode may be formed of or include a doped semiconductor and/or a metallic material. The gate dielectric layer may be, e.g., a thermal oxide layer. A spacer may be provided on a sidewall of the gate electrode. The spacer may include at least one of, e.g., an oxide layer, an oxynitride layer, or a nitride layer. As shown, the word lines WL may be provided on a top surface of the substrate 100, but in certain embodiments, the word lines WL may be buried in an upper portion of the substrate 100.

A peripheral gate line PG may be provided on the peripheral circuit region PCR of the substrate 100. The peripheral gate line PG may serve as a gate electrode of a peripheral circuit transistor provided on the peripheral circuit region PCR. The peripheral gate line PG may be concurrently formed with the word lines WL, but example embodiments are be limited thereto.

As illustrated in FIG. 6, a first interlayered insulating layer 111 may be formed to cover the word lines WL and the peripheral gate line PG, and contacts 121 may be connected to the source/drain regions 101 through the first interlayered insulating layer 111. The first interlayered insulating layer 111 may be, e.g., a silicon oxide layer, which may be formed by a chemical vapor deposition process. The source/drain regions 101 may be connected to magnetic tunnel junctions, which will be formed in a subsequent process, through the contacts 121. Although not shown, source contacts may be connected to some of the source/drain regions 101, on which the contacts 121 are not provided. The contacts 121 may include at least one of metals, conductive metal nitrides, or doped semiconductor materials.

Conductive pads 125 may be provided on and connected to the contacts 121. The formation of the conductive pads 125 may include forming a conductive layer on the contacts 121 and then forming a gap-filling insulating layer 126 to penetrate the conductive layer. In addition, a planarization process may be performed on the gap-filling insulating layer 126 to expose top surfaces of the conductive pads 125. Alternatively, the formation of the conductive pads 125 may include forming an insulating layer with recess regions on the contacts 121 and then forming the conductive pads 125 to fill the recess regions, respectively. The conductive pads 125 may include at least one of metals, conductive metal nitrides, or doped semiconductor materials. The gap-filling insulating layer 126 may include at least one of, e.g., a silicon oxide layer, a silicon nitride layer, or a silicon oxynitride layer. In certain embodiments, as shown in FIG. 6, the contacts 121 and the conductive pads 125 may be locally provided on the cell array region CAR, but in other embodiments, they may also be provided on the peripheral circuit region PCR.

Figure 7:
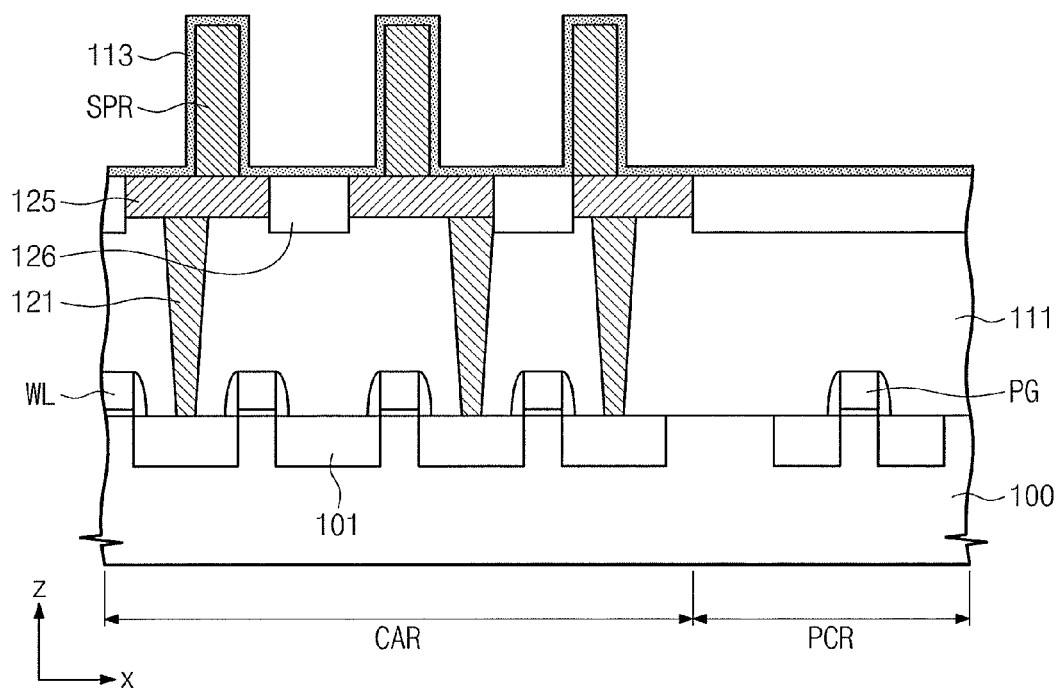

Referring to FIGS. 4, 5, and 7, conductive pillars SPR may be formed on the conductive pads 125, respectively. In example embodiments, the formation of the conductive pillars SPR may include forming a conductive layer on the contacts 121 and patterning the conductive layer. In other example embodiments, the formation of the conductive pillars SPR may include forming an insulating layer with recess regions on the contacts 121 and filling the recess regions with a conductive material. The conductive pillars SPR may be formed of or include at least one of metals, conductive metal nitrides, or doped semiconductor materials. As an example, the conductive pillars SPR may include titanium nitride and/or tungsten. The conductive pillars SPR may be two-dimensionally disposed on the substrate 100. For example, the conductive pillars SPR may be arranged spaced apart from each other in the x and y directions on the substrate 100. The conductive pillars SPR may be locally provided on the cell array region CAR.

Each of the conductive pillars SPR may be formed to have a length shorter than those of the contacts 121 along a direction normal to the substrate 100, i.e., the conductive pillars SPR may be shorter than the contacts 121 along a z direction. As an example, the conductive pillars SPR may have a length ranging from about 400 Å to about 1200 Å. The length of the conductive pillars SPR may determine heights of an air gap and an expanded air gap along the z direction, which will be formed in subsequent processes. As shown, the conductive pillars SPR may be spaced apart from each other by the same distance, but example embodiments of the inventive concepts may not be limited thereto.

A capping insulating layer 113 may be formed on the structure provided with the conductive pillars SPR. The capping insulating layer 113 may be formed to conformally cover side and top surfaces of the conductive pillars SPR and a top surface of the gap-filling insulating layer 126. The capping insulating layer 113 may be formed of or include, e.g., silicon nitride or silicon oxynitride. The capping insulating layer 113 may be formed using a plasma enhanced chemical vapor deposition (PE-CVD) process or a physical vapor deposition (PVD) process.

Figure 8:
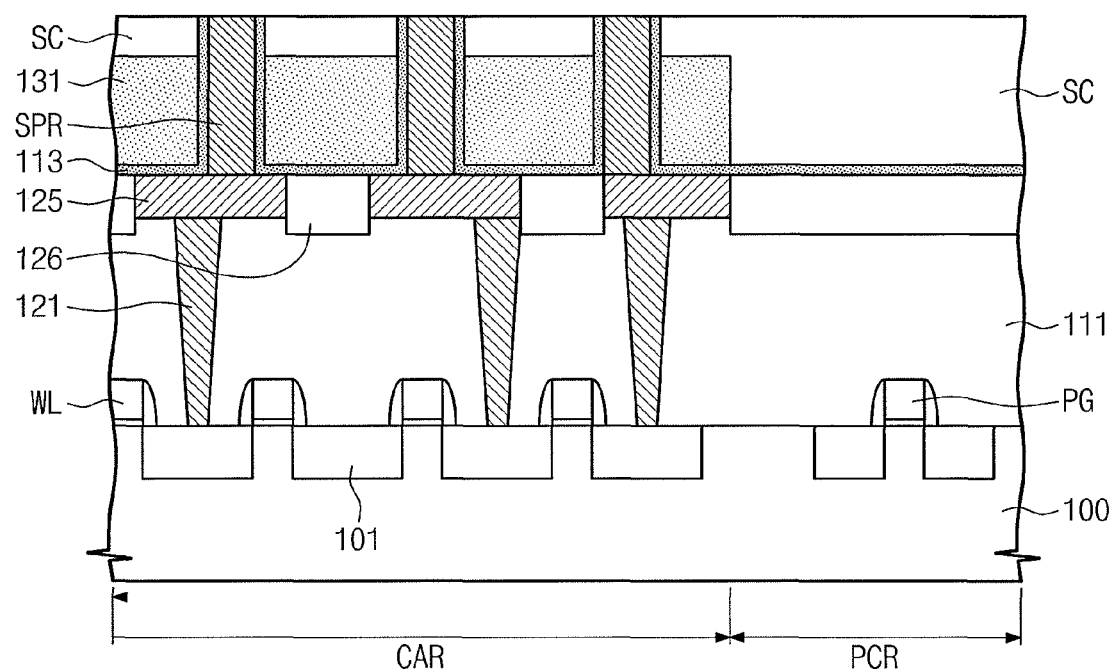

Referring to FIGS. 4, 5, and 8, a sacrificial layer 131 may be formed between the conductive pillars SPR. The sacrificial layer 131 may be formed of or include a silicon organic hybrid (SOH) layer. In certain embodiments, the sacrificial layer 131 may include a material having an etch selectivity with respect to a molding structure to be described below. The sacrificial layer 131 may be formed using a chemical vapor deposition (CVD) process.

The sacrificial layer 131 may be formed in such a way that a top surface thereof is lower than those of the conductive pillars SPR. For example, the formation of the sacrificial layer 131 may include etching the sacrificial layer 131 until the top surface thereof is lower than the top surfaces of the conductive pillars SPR. The sacrificial layer 131 may be locally provided on the cell array region CAR. For example, the formation of the sacrificial layer 131 may further include forming a sacrificial layer on the whole top surface of the substrate 100 and removing a portion of the sacrificial layer, located on the peripheral circuit region PCR, through an etching process.

A molding structure SC may be formed on the structure provided with the sacrificial layer 131. The molding structure SC may include a material having an etch selectivity with reference to, e.g., the sacrificial layer 131. As an example, in the case where the sacrificial layer 131 includes silicon oxide, the molding structure SC may be formed to include silicon nitride. Alternatively, the sacrificial layer 131 may be formed to include polysilicon, and the molding structure SC may be formed to include silicon oxide or silicon nitride.

On the cell array region CAR, the molding structure SC may be formed on upper sidewalls of the conductive pillars SPR provided with the capping insulating layer 113. As an example, the formation of the molding structure SC may include forming an insulating layer to cover the structure provided with the sacrificial layer 131 and then performing a planarization process to expose the top surfaces of the conductive pillars SPR. An upper portion of the capping insulating layer 113 may be removed during the planarization process, and thus, the conductive pillars SPR may be exposed. On the peripheral circuit region PCR, the molding structure SC may be formed to be in contact with a side surface of the sacrificial layer 131 and a top surface of the capping insulating layer 113. The sacrificial layer 131 and the molding structure SC may be formed using a CVD or PVD process.

Figure 9:
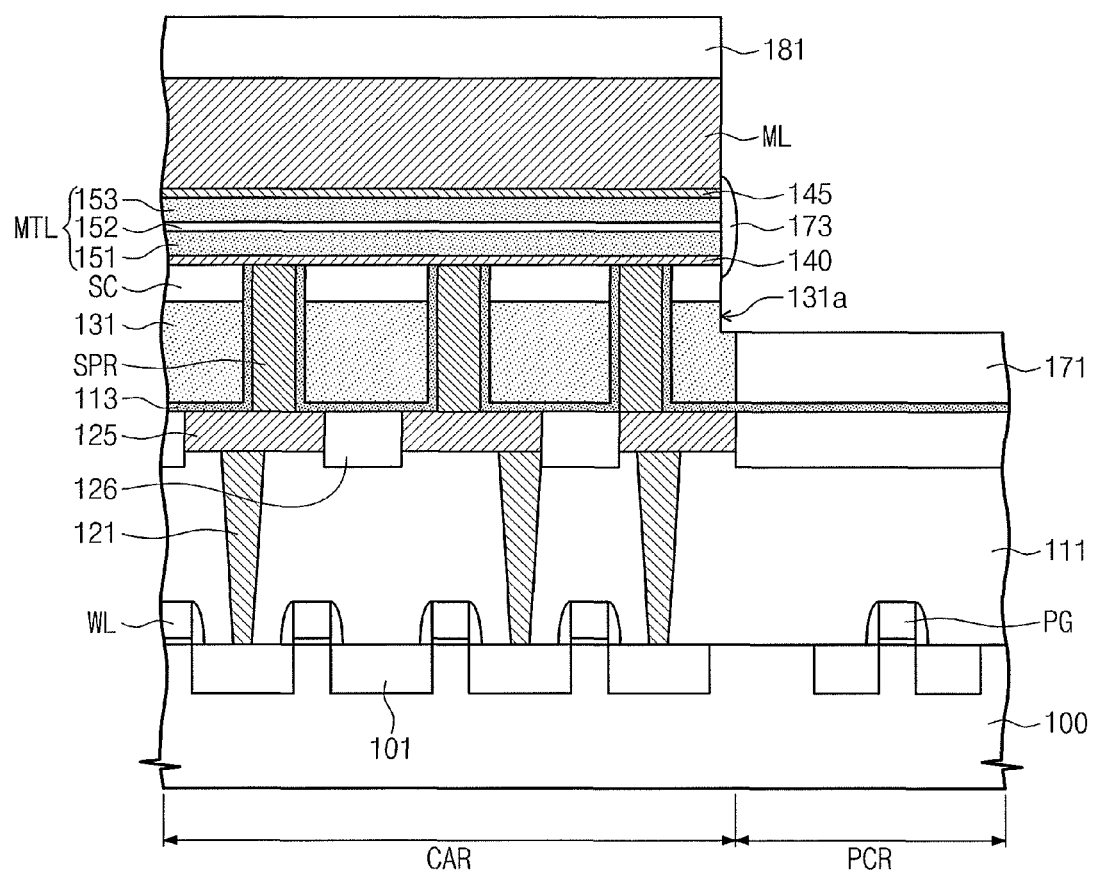

Referring to FIGS. 4, 5, and 9, a lower electrode layer 140, a magnetic tunnel junction layer MTL, and an upper electrode layer 145 may be sequentially formed on the structure provided with the molding structure SC. The lower and upper electrode layers 140 and 145 may be formed of or include at least one of metals, conductive metal nitrides, or doped semiconductor materials. In certain embodiments, at least one of the lower electrode layer 140, the magnetic tunnel junction layer MTL, or the upper electrode layer 145 may be formed using a PVD process.

The magnetic tunnel junction layer MTL may include a first magnetic layer 151, a tunnel insulating layer 152, and a second magnetic layer 153. The magnetic tunnel junction layer MTL will be described in more detail with reference to FIGS. 32 and 33.

A conductive mask layer ML and an insulating mask pattern 181 may be formed on the upper electrode layer 145. The conductive mask layer ML may be formed by a patterning process using the insulating mask pattern 181 as an etch mask. The conductive mask layer ML may include, e.g., tungsten and/or titanium nitride. The insulating mask pattern 181 may include at least one of, e.g., silicon oxide, silicon nitride, or silicon oxynitride. The conductive mask layer ML may be formed to cover the cell array region CAR and expose the peripheral circuit region PCR.

At least one of the layers stacked on the peripheral circuit region PCR may be removed using the conductive mask layer ML as an etch mask. For example, an etching process using the conductive mask layer ML as the etch mask may be performed to remove the upper electrode layer 145, the magnetic tunnel junction layer MTL, and the lower electrode layer 140 from the peripheral circuit region PCR. In example embodiments, during the etching process, an upper portion of the molding structure SC may be removed from the peripheral circuit region PCR to form a capping interlayered insulating layer 171 spaced apart from the molding structure SC remaining on the cell array region CAR and expose the sacrificial layer 131. For example, as illustrated in FIG. 9, an upper surface of the capping interlayered insulating layer 171 in the peripheral circuit region PCR may be lower than a bottom surface of the molding structure SC in the cell array region CAR, and a side surface 131a of the sacrificial layer 131 may be exposed between the capping interlayered insulating layer 171 and the molding structure SC. Further, conductive particles, which are unintentionally formed on the peripheral circuit region PCR, may also be removed during the etching process.

A thermal oxidation process may be performed on a sidewall of the magnetic tunnel junction layer MTL exposed by the etching process. As a result of the oxidation process, a capping oxide layer 173 may be formed on the exposed sidewall of the magnetic tunnel junction layer MTL. The capping oxide layer 173 may protect the magnetic tunnel junction layer MTL against harmful environment in a subsequent process. In certain embodiments, the formation of the capping oxide layer 173 may be omitted.

Figure 10:
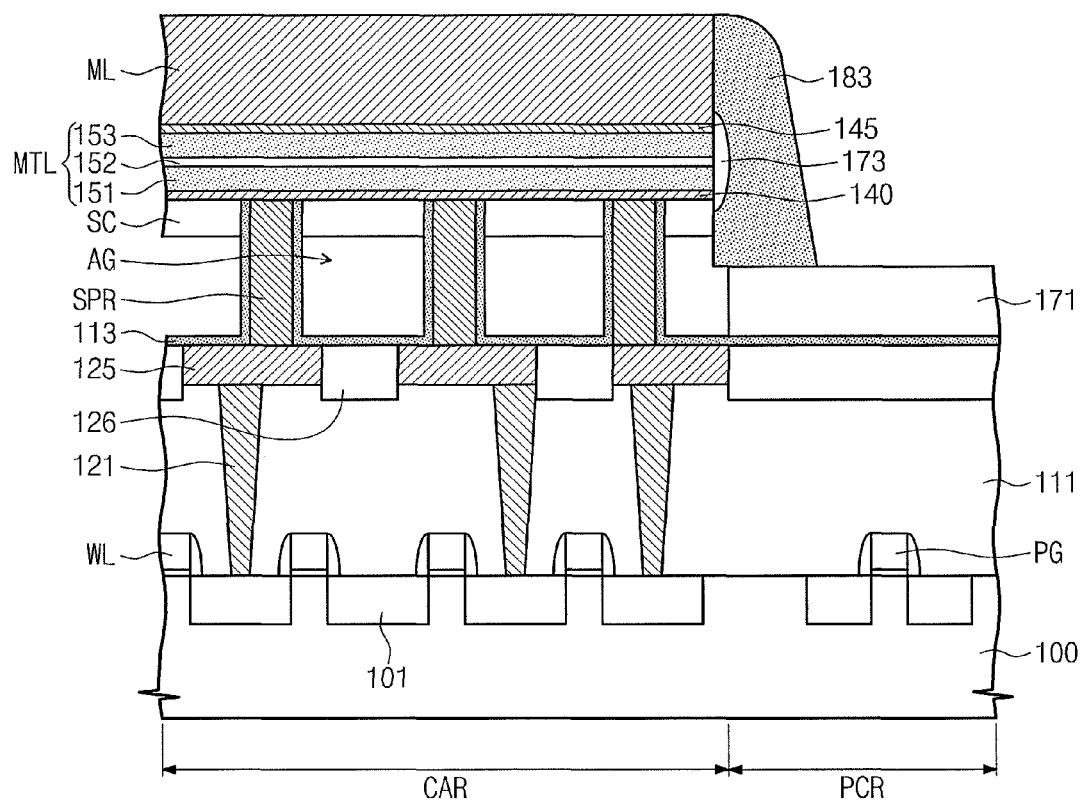

Referring to FIGS. 4, 5, and 10, the insulating mask pattern 181 may be removed, and then the sacrificial layer 131 may be selectively removed to form an air gap AG. For example, after the formation of the lower electrode layer 140 and the magnetic tunnel junction layer MTL, the sacrificial layer 131 may be removed through the exposed side surface 131a thereof between the cell array region CAR and the peripheral circuit region PCR. The air gap AG may be an empty space delimited, e.g., enclosed, by the capping insulating layer 113 and the molding structure SC. In the case where the sacrificial layer 131 includes the SOH layer, the removal of the sacrificial layer 131 may include an aching process and/or an ultraviolet irradiation process. In the case where the sacrificial layer 131 has an etch selectivity with reference to the molding structure SC, the removal of the sacrificial layer 131 may include a selective etching process. For example, the molding structure SC may not be removed in the process of removing the sacrificial layer 131.

After the removal of the sacrificial layer 131, a spacer insulating layer 183 may be formed on the sidewall of the magnetic tunnel junction layer MTL to hermetically seal the air gap AG. The spacer insulating layer 183 may be formed to be in contact with a sidewall of the molding structure SC and a top surface of the capping interlayered insulating layer 171. The spacer insulating layer 183 may include a material having an etch selectivity with respect to the molding structure SC. As an example, in the case where the molding structure SC includes silicon oxide, the spacer insulating layer 183 may include silicon nitride. The formation of the spacer insulating layer 183 may include forming an insulating layer on the structure, from which the sacrificial layer 131 is removed, and performing a dry etching process to the insulating layer.

Figure 11:
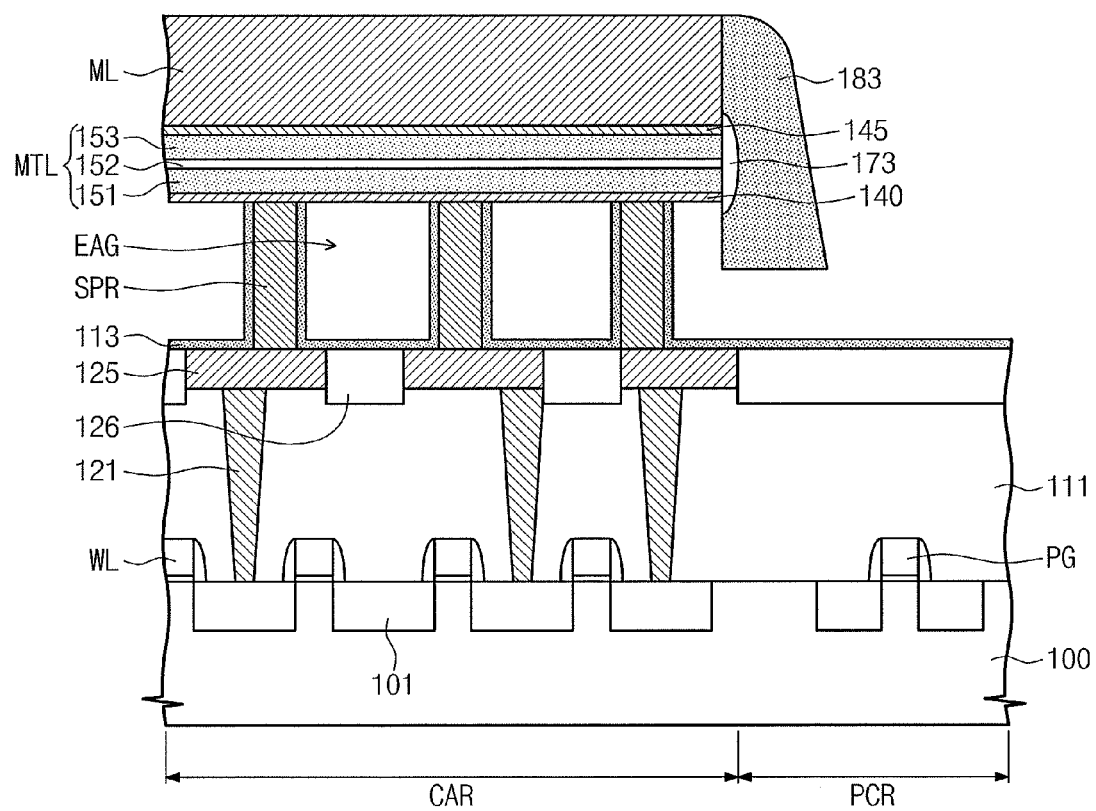

Referring to FIGS. 4, 5, and 11, the capping interlayered insulating layer 171 and the molding structure SC may be removed to form an expanded air gap EAG. In other words, the removal of the molding structure SC may be performed after removing the sacrificial layer 131. The removal of the capping interlayered insulating layer 171 and the molding structure SC may include a selective etching process. For example, the selective etching process may be performed to remove the capping interlayered insulating layer 171, and then, the molding structure SC may be removed using an etchant, which is supplied through a gap region (i.e., the air gap AG), which is formed by the removal of the capping interlayered insulating layer 171. Accordingly, the expanded air gap EAG may be formed to expose a bottom surface of the lower electrode layer 140.

The molding structure SC may be removed through a boundary between the cell array region CAR and the peripheral circuit region PCR. For example, the molding structure SC may be etched and exhausted through one of edges of each cell array region CAR of FIG. 4 adjacent to the peripheral circuit region PCR. As an example, each cell array region CAR may include first to fourth edges adjacent to the peripheral circuit region PCR, and the molding structure SC may be removed through at least one of the first to fourth edges.

Figure 12:
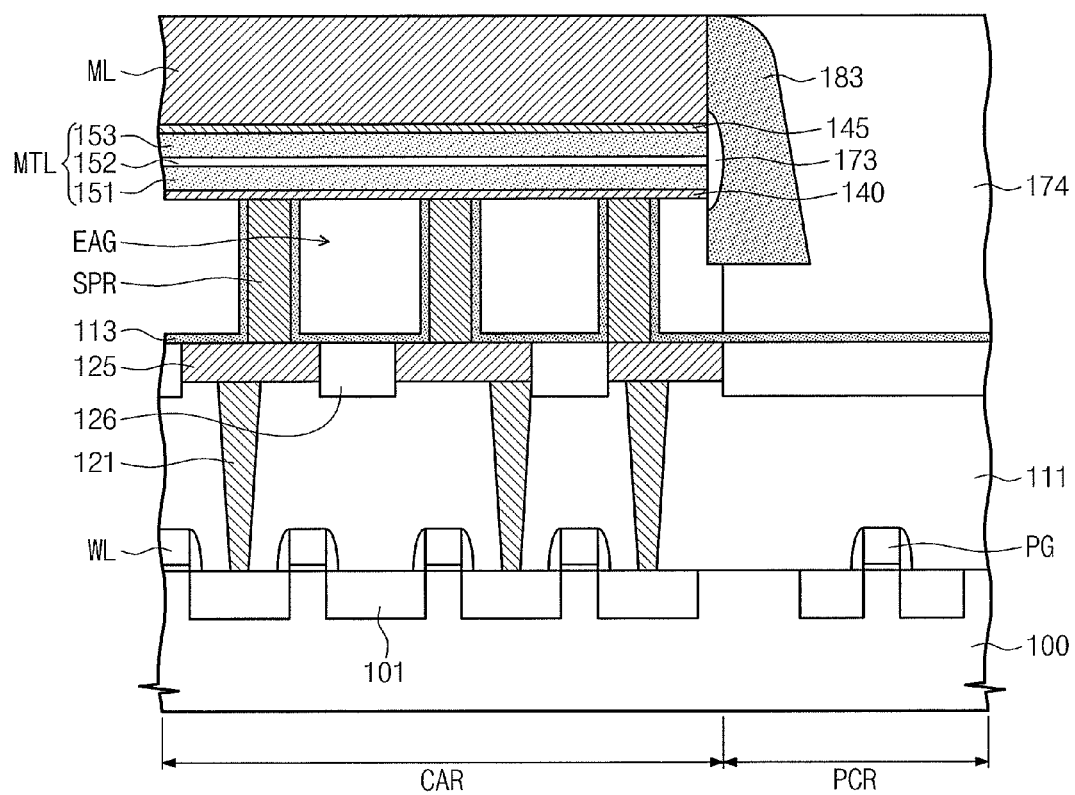

Referring to FIGS. 4, 5, and 12, a second interlayered insulating layer 174 may be formed to hermetically seal the expanded air gap EAG. The second interlayered insulating layer 174 may be formed to fill a gap region between the spacer insulating layer 183 and the capping insulating layer 113, but not to fill the expanded air gap EAG. The second interlayered insulating layer 174 may be formed by an atomic layer deposition (ALD) process. In other example embodiments, the second interlayered insulating layer 174 may be formed of an insulating layer having a poor step coverage property. As an example, the second interlayered insulating layer 174 may be formed using a PE-CVD or PVD process. The formation of the second interlayered insulating layer 174 may include a planarization process for exposing the conductive mask layer ML.

Figure 13:
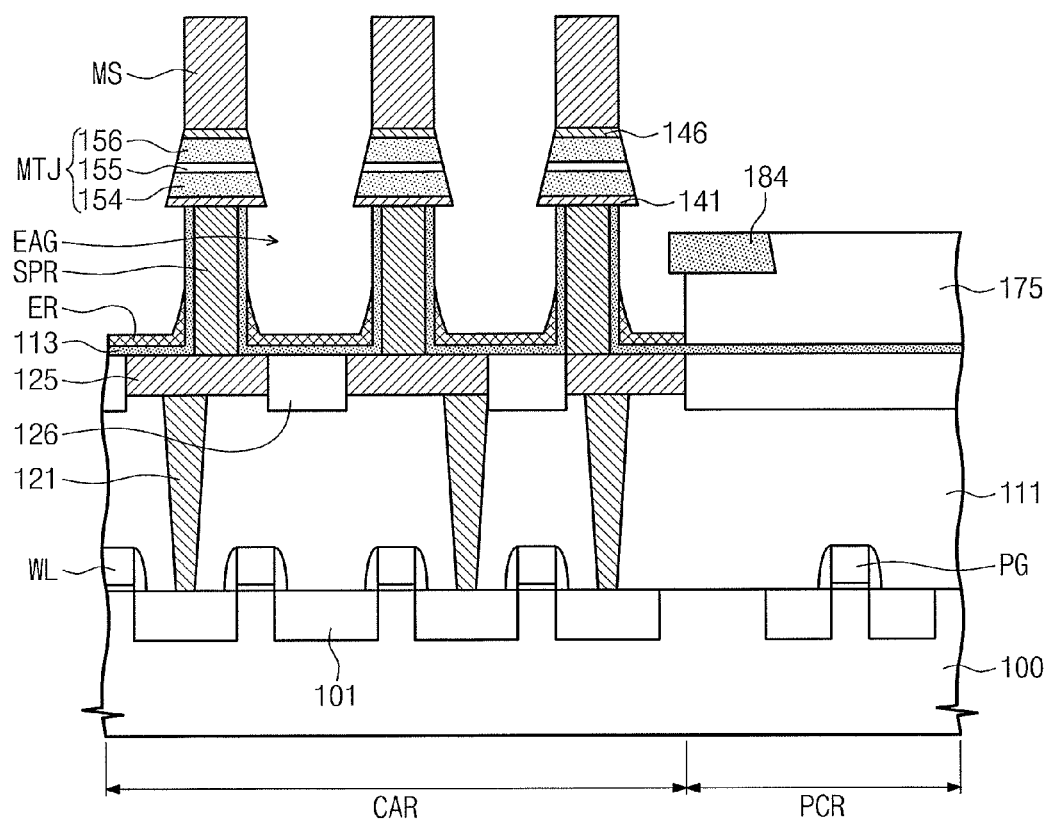

Referring to FIGS. 4, 5, and 13, a patterning process may be performed on the magnetic tunnel junction layer MTL to form magnetic tunnel junction structures MTJ. Each of the magnetic tunnel junction structures MTJ may include a first magnetic pattern 154, a tunnel insulating pattern 155, and a second magnetic pattern 156. The formation of the magnetic tunnel junction structures MTJ may include forming insulating mask patterns on the conductive mask layer ML, patterning the conductive mask layer ML to form conductive mask patterns MS, and then, patterning the magnetic tunnel junction layer MTL using the conductive mask patterns MS as an etch mask. During the patterning of the magnetic tunnel junction layer MTL, the lower electrode layer 140 and the upper electrode layer 145 may be etched to form lower electrode patterns 141 and upper electrode patterns 146.

When viewed in a plan view, the conductive mask patterns MS may be formed to be substantially aligned with the conductive pillars SPR. A sputtering process may be used in at least one of the processes for forming the conductive mask patterns MS and the magnetic tunnel junction structures MTJ. As described with reference to FIGS. 1 through 3, the expanded air gap EAG may be exposed during the patterning process, and thus, the conductive etch residue layer ER, which is made of by-products of the sputtering process, may be formed on a bottom of the expanded air gap EAG.

In the patterning process, an upper portion of the second interlayered insulating layer 174 may be etched to form a remaining interlayered insulating layer 175 on the peripheral circuit region PCR. An upper portion of the spacer insulating layer 183 may be etched to form a remaining spacer insulating layer 184 on the peripheral circuit region PCR.

Figure 14:
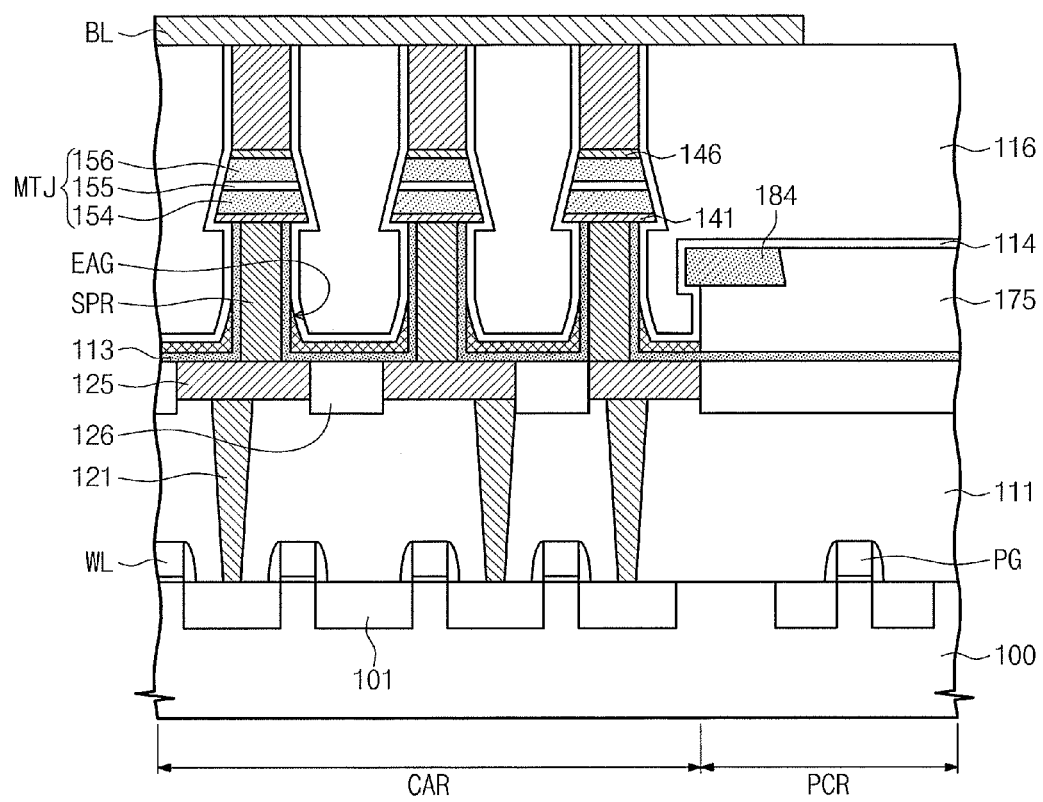

Referring to FIGS. 4, 5, and 14, a protection insulating layer 114 and a third interlayered insulating layer 116 may be sequentially formed on the structure provided with the magnetic tunnel junction structures MTJ. The protection insulating layer 114 may be formed of or include, e.g., silicon nitride, silicon oxynitride, or aluminum oxide. The third interlayered insulating layer 116 may be formed of silicon oxide. The protection insulating layer 114 and the third interlayered insulating layer 116 may be formed by a CVD process.

A planarization process may be performed to expose top surfaces of the conductive mask patterns MS. In certain embodiments, the protection insulating layer 114 and the third interlayered insulating layer 116 may be partially removed during the planarization process. Bit lines BL may be formed on the exposed top surfaces of the conductive mask patterns MS. As illustrated in FIG. 5, the bit lines BL may be arranged spaced apart from each other in the y direction, and may extend parallel to the x direction. The bit lines BL may be formed of, e.g., at least one of metals or conductive metal nitrides.

According to example embodiments, the expanded air gap may be formed in advance, before a patterning process for forming the magnetic tunnel junction structures. Thus, re-deposition of etch residues on the magnetic tunnel junction structures may be prevented or substantially minimized. Accordingly, it is possible to prevent an electric short caused by re-deposition of etch residues.

Further, both the sacrificial layer and the molding structure may be removed in advance, before the patterning process for forming the magnetic tunnel junction structures. Thus, the patterning process for forming the expanded air gap can be easily performed.

In addition, there is no need to perform an additional etching process for removing a re-deposited etch residue layer after the patterning process, thereby reducing consumption of the conductive mask patterns MS. Accordingly, the magnetic tunnel junction patterns and the bit line can be more easily connected to each other via the conductive mask patterns MS.

The magnetic memory device according to example embodiments will be again described with reference to FIGS. 4, 5, and 14.

The substrate 100 with the cell array region CAR and the peripheral circuit region PCR may be provided. The selection devices may be provided on the cell array region CAR of the substrate 100. The selection devices may be, e.g., transistors. For example, the word lines WL serving as gate electrodes of the transistors may be provided on the substrate 100, and the source/drain regions 101 serving as source/drain electrodes of the transistors may be provided in the substrate 100 between the word lines WL. The word lines WL may be arranged along the x direction and may extend in the y direction crossing the first direction. The peripheral gate line PG may be provided on the peripheral circuit region PCR of the substrate 100.

The first interlayered insulating layer 111 may be provided to cover the word lines WL and the peripheral gate line PG, and the contacts 121 may be provided through the first interlayered insulating layer 111 and may be connected to the source/drain regions 101, respectively. The first interlayered insulating layer 111 may be, e.g., a silicon oxide layer. The contacts 121 may include at least one of metals, conductive metal nitrides, or doped semiconductor materials.

The conductive pads 125 may be provided on and connected to the contacts 121. The contacts 121 may be separated from each other by the gap-filling insulating layer 126. The conductive pads 125 may include at least one of metals, conductive metal nitrides, or doped semiconductor materials. The gap-filling insulating layer 126 may include at least one of a silicon oxide layer, a silicon nitride layer, or a silicon oxynitride layer.

The conductive pillars SPR may be provided on the conductive pads 125. The conductive pillars SPR may be provided on the cell array region CAR. When viewed in a plan view, the conductive pillars SPR may be two-dimensionally arranged spaced apart from each other in the x and y directions. The conductive pillars SPR may be formed of or include at least one of metals, conductive metal nitrides, or doped semiconductor materials. As an example, the conductive pillars SPR may include titanium nitride and/or tungsten. Each of the conductive pillars SPR may have a length that is larger than a thickness of the magnetic tunnel junction structure MTJ and is smaller than a length of the contacts 121. As an example, the conductive pillars SPR may have a length ranging from about 400 Å to about 1200 Å.

The capping insulating layer 113 may be provided on the sidewalls of the conductive pillars SPR. The capping insulating layer 113 may extend from the sidewalls of the conductive pillars SPR to the top surface of the gap-filling insulating layer 126. The capping insulating layer 113 may be formed of or include, e.g., silicon nitride or silicon oxynitride.

The lower electrode patterns 141, the magnetic tunnel junction structures MTJ, and the upper electrode patterns 146 may be sequentially stacked on the conductive pillars SPR. The uppermost surface of the capping insulating layer 113 may be in contact with the bottom surface of the lower electrode pattern 141. The lower electrode patterns 141, the magnetic tunnel junction structures MTJ, and the upper electrode patterns 146 may have side surfaces that are substantially coplanar with each other. The magnetic tunnel junction structures MTJ will be described in more detail with reference to FIGS. 32 and 33.

The conductive mask patterns MS and the bit lines BL may be sequentially provided on the magnetic tunnel junction structures MTJ. In other words, the magnetic tunnel junction structures MTJ may be electrically connected to the bit lines BL via the conductive mask patterns MS. The conductive mask patterns MS and the bit lines BL may include at least one of metals or conductive metal nitrides.

The remaining interlayered insulating layer 175 may be provided on the capping insulating layer 113 of the peripheral circuit region PCR. The remaining interlayered insulating layer 175 may have an end portion located on a boundary between the peripheral circuit region PCR and the cell array region CAR. The remaining interlayered insulating layer 175 may have a top surface that is lower than the bottom surfaces of the lower electrode patterns 141. The remaining spacer insulating layer 184 may be provided at a side of the remaining interlayered insulating layer 175. The remaining spacer insulating layer 184 may be buried in an upper side portion of the remaining interlayered insulating layer 175. The remaining spacer insulating layer 184 may have a top surface that is coplanar with that of the remaining interlayered insulating layer 175, but example embodiments are not limited thereto. The remaining spacer insulating layer 184 may be provided near the boundary between the cell array region CAR and the peripheral circuit region PCR, and may have a bottom surface higher than the bottom surface of the conductive pillar SPR and a top surface lower than the top surface of the conductive pillar SPR. The remaining spacer insulating layer 184 may extend along the boundary between the cell array region CAR and the peripheral circuit region PCR.

The remaining spacer insulating layer 184 may include a material having an etch selectivity with respect to the remaining interlayered insulating layer 175. As an example, the remaining spacer insulating layer 184 may include silicon nitride.

The protection insulating layer 114 may be provided to conformally cover the conductive mask patterns MS, the upper and lower electrode patterns 141 and 146, the magnetic tunnel junction structures MTJ, and the conductive pillars SPR. The third interlayered insulating layer 116 may be provided on the protection insulating layer 114 to fill a gap region between the magnetic tunnel junction structures MTJ. The protection insulating layer 114 may include, e.g., at least one of a silicon nitride layer, a silicon oxynitride layer, or an aluminum oxide layer, and the third interlayered insulating layer 116 may include, e.g., a silicon oxide layer. The protection insulating layer 114 and the third interlayered insulating layer 116 may be laterally extended to cover the remaining spacer insulating layer 184 and the remaining interlayered insulating layer 175.

The conductive etch residue layer ER may remain between the conductive pillars SPR. For example, the conductive etch residue layer ER may be interposed between the protection insulating layer 114 and the capping insulating layer 113. The conductive etch residue layer ER may include a lower portion and an upper portion, which is vertically extended from the lower portion to cover the sidewalls of the conductive pillars SPR, but example embodiments are not limited thereto. The conductive etch residue layer ER may be formed of a residue, which occurs in a sputtering process for forming the magnetic tunnel junction structures MTJ. Thus, a conductive element contained in the conductive etch residue layer ER may be the same as at least one of constituents of the magnetic tunnel junction structures MTJ.

FIGS. 15 through 22 are sectional views taken along line A-A' of FIG. 5 to illustrate a method of fabricating a magnetic memory device according to other example embodiments. For concise description, a previously described element may be identified by a similar or identical reference number without repeating an overlapping description thereof.

Figure 15:
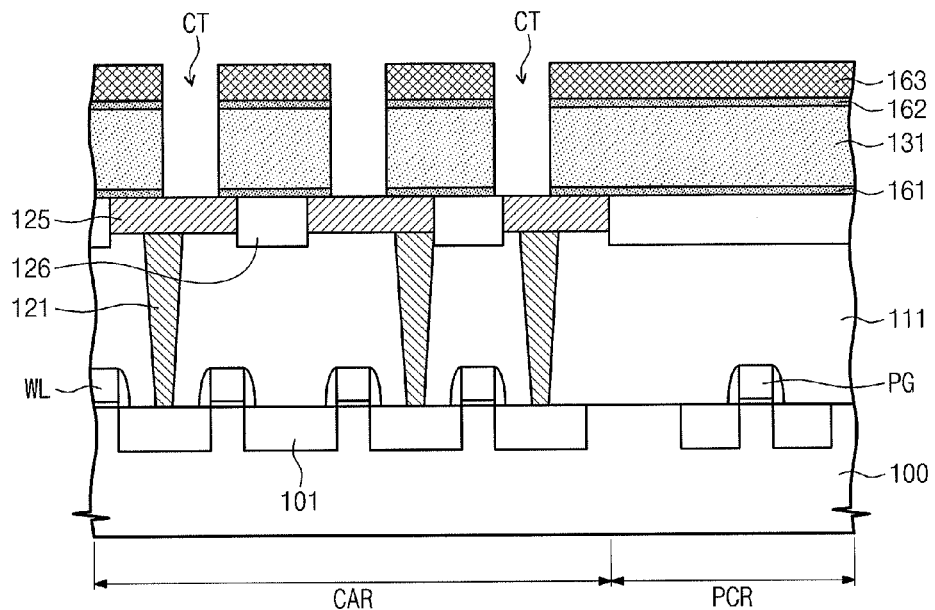
FIGS. 15 through 22 are cross-sectional views along line A-A' of FIG. 5, which illustrate stages in a method of fabricating a magnetic memory device according to other example embodiments.

Referring to FIG. 15, a pad insulating layer 161, a sacrificial layer 131, an etch stop layer 162, and an upper insulating layer 163 may be sequentially formed on the structure described with reference to FIG. 6. The pad insulating layer 161 may include, e.g., silicon nitride. The sacrificial layer 131 may include at least one of, e.g., SOH, silicon oxide, or silicon oxynitride. The etch stop layer 162 may include, e.g., silicon nitride, and the upper insulating layer 163 may include, e.g., silicon oxide.

Contact holes CT may be formed to penetrate the upper insulating layer 163, the etch stop layer 162, the sacrificial layer 131, and the pad insulating layer 161. The contact holes CT may be locally formed on the cell array region CAR, but example embodiments are not limited thereto. The contact holes CT may be two-dimensionally arranged on the substrate 100.

Figure 16:
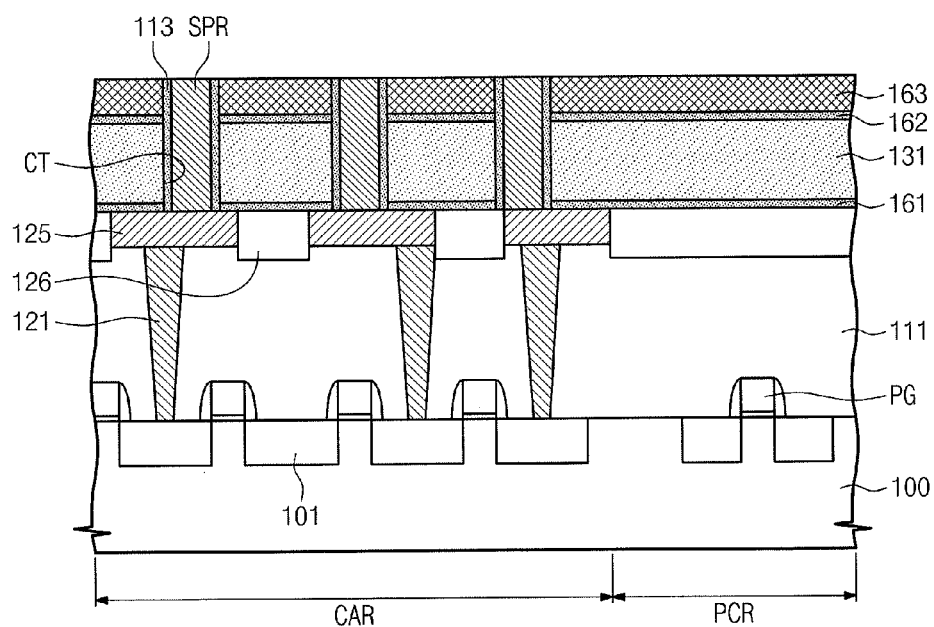

Referring to FIG. 16, the capping insulating layer 113 may be formed on a sidewall of the contact hole CT. The formation of the capping insulating layer 113 may include forming an insulating layer on the structure provided with the contact hole CT and performing a dry etching process on the insulating layer. The capping insulating layer 113 may be formed to expose the conductive pads 125. The capping insulating layer 113 may be formed of or include the same material as the pad insulating layer 161. The conductive pillars SPR may be formed to fill the contact holes CT, respectively. The conductive pillars SPR may include at least one of metals or conductive metal nitrides. The formation of the conductive pillars SPR may include a planarization process to expose the upper insulating layer 163.

Figure 17:
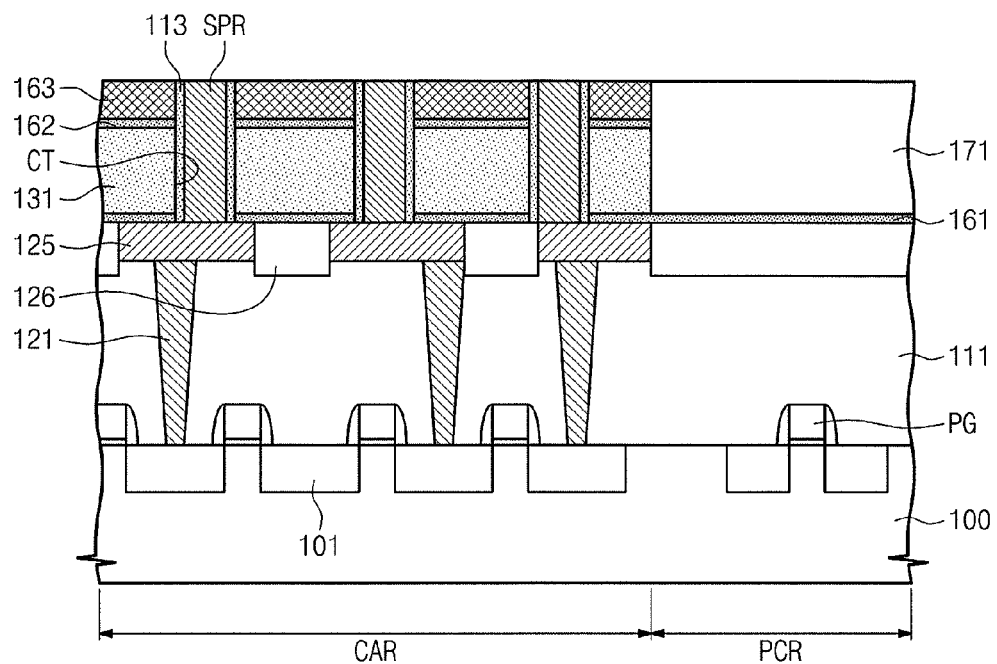

Referring to FIG. 17, a mask pattern may be formed to cover the cell array region CAR and expose the peripheral circuit region PCR, and a patterning process using the mask pattern as an etch mask may be performed to remove at least one of layers provided on the peripheral circuit region PCR. For example, the sacrificial layer 131, the etch stop layer 162, and the upper insulating layer 163 may be removed from the peripheral circuit region PCR to form a recess region. Thereafter, a capping interlayered insulating layer 171 may be formed to fill the recess region. The capping interlayered insulating layer 171 may include, e.g., silicon oxide. A planarization process may be performed on the capping interlayered insulating layer 171 to expose the top surface of the upper insulating layer 163 on the cell array region CAR.

Figure 18:
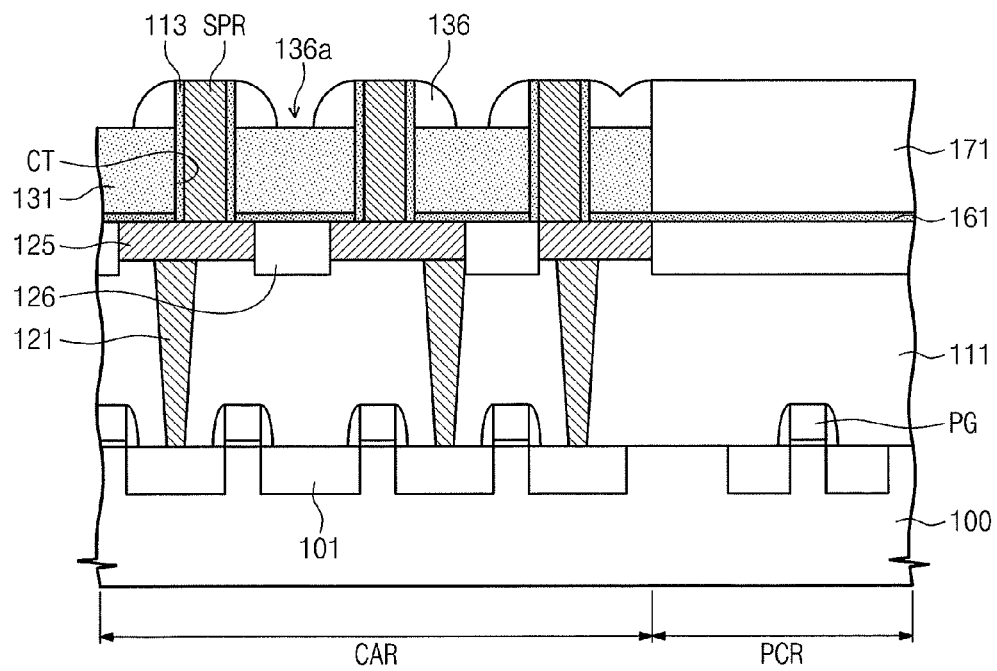

Referring to FIG. 18, the upper insulating layer 163 may be removed from the cell array region CAR. Due to the presence of the etch stop layer 162, the sacrificial layer 131 can be protected during removal of the upper insulating layer 163. The etch stop layer 162 may be removed using the process of removing the upper insulating layer 163 or an additional etching process.

First molding patterns 136 may be formed on upper sidewalls of the conductive pillars SPR covered with the capping insulating layer 113. For example, the formation of the first molding patterns 136 may include forming an insulating layer on the structure, from which the upper insulating layer 163 and the etch stop layer 162 are removed, followed by a dry etching process on the insulating layer to form each of the first molding patterns 136 with a spacer-shaped structure. When viewed in a plan view, each of the first molding patterns 136 may be shaped like a ring enclosing a corresponding one of the conductive pillars SPR. The first molding patterns 136 may be formed to partially expose the sacrificial layer 131.

The first molding patterns 136 may include a material having an etch selectivity with respect to the sacrificial layer 131. For example, in the case where the sacrificial layer 131 includes silicon oxide, the first molding patterns 136 may include silicon nitride. In another example, when the sacrificial layer 131 includes polysilicon, the first molding patterns 136 may include silicon oxide or silicon nitride.

Figure 19:
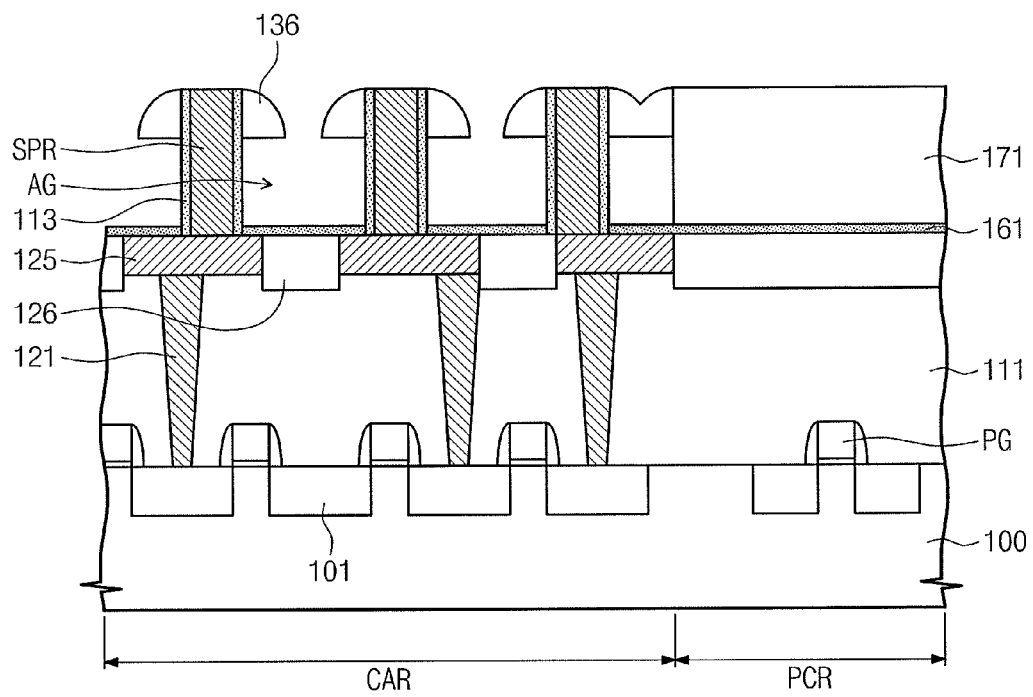

Referring to FIG. 19, the sacrificial layer 131 may be removed to form an air gap AG. For example, the removal of the sacrificial layer 131 may be performed through gap regions 136a between adjacent first molding patterns 136, as illustrated in FIG. 18. In the case where the sacrificial layer 131 includes the SOH layer, the removal of the sacrificial layer 131 may include an ashing process and/or an ultraviolet irradiation process. In the case where the sacrificial layer 131 has an etch selectivity with reference to the first molding patterns 136, the removal of the sacrificial layer 131 may include a selective etching process. For example, the first molding patterns 136 may not be removed in the process of removing the sacrificial layer 131.

Figure 20:
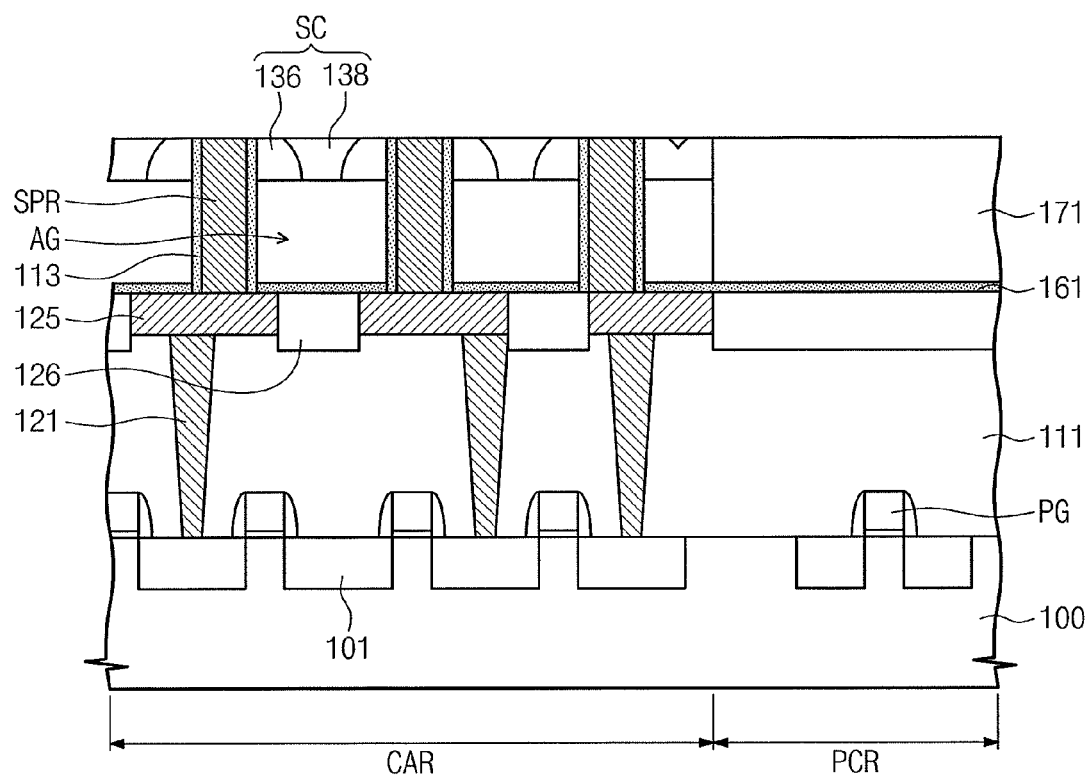

Referring to FIG. 20, second molding patterns 138 may be formed to fill the gap regions between the first molding patterns 136. The second molding patterns 138 may be formed of the same material as the first molding patterns 136. For example, the second molding patterns 138 may be formed using an atomic layer deposition (ALD) process. In other example embodiments, the second molding patterns 138 may be formed of an insulating layer having a poor step coverage property. As an example, the second molding patterns 138 may be formed using a PE-CVD or PVD process. Accordingly, at least a portion of the air gap AG may not be filled with the second molding patterns 138 and may remain as an empty space. The formation of the second molding patterns 138 may include a planarization process to expose the top surfaces of the conductive pillars SPR. As a result, a molding structure SC including the first and second molding patterns 136 and 138 may be formed, i.e., defined, between adjacent conductive pillars SPR. In certain embodiments, the planarization process of the second molding patterns 138 may be performed to remove upper portions of the first molding patterns 136 and the capping insulating layer 113 and expose the top surface of the capping interlayered insulating layer 171.

Figure 21:
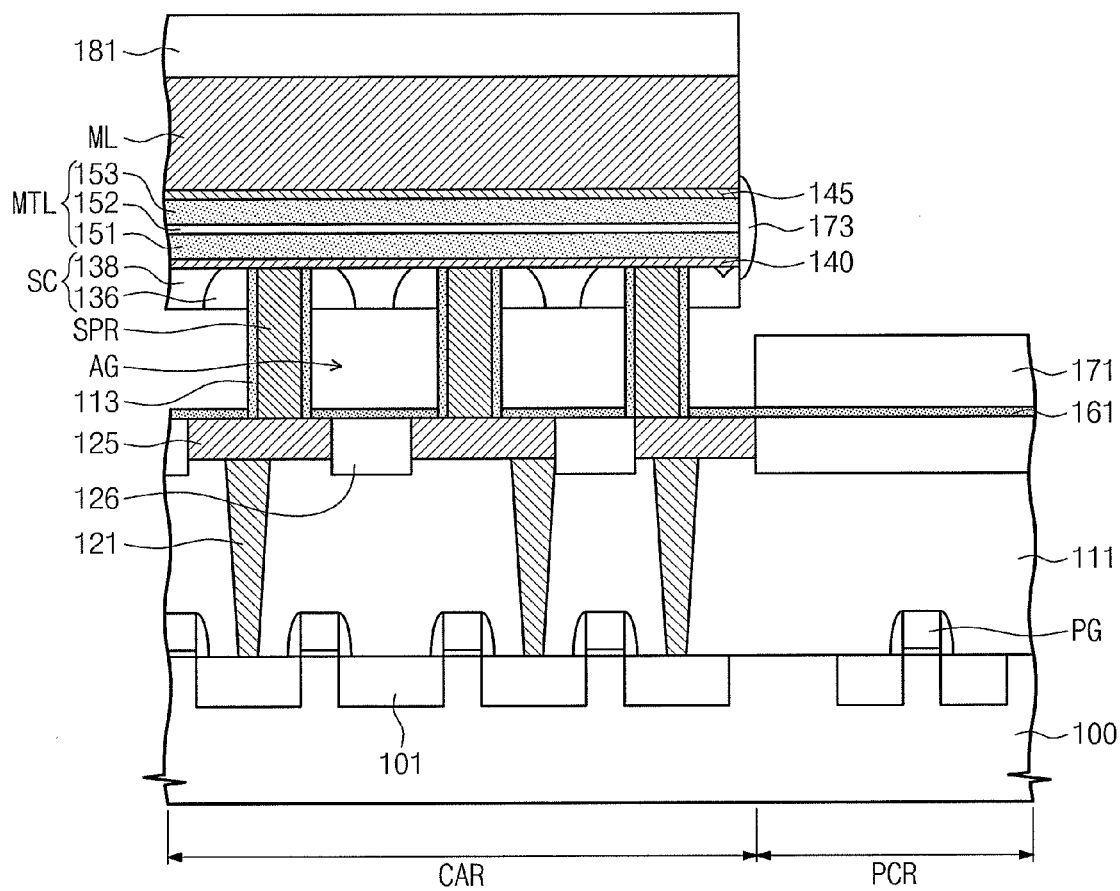

Referring to FIG. 21, the lower electrode layer 140, the magnetic tunnel junction layer MTL, and the upper electrode layer 145 may be sequentially formed on the structure provided with the molding structure SC. In other words, according to the present embodiments, the lower electrode layer 140 and the magnetic tunnel junction layer MTL may be formed after removing the sacrificial layer 131 of FIG. 18. The lower and upper electrode layers 140 and 145 may be formed of or include at least one of metals, conductive metal nitrides, or doped semiconductor materials. In certain embodiments, at least one of the lower electrode layer 140, the magnetic tunnel junction layer MTL, or the upper electrode layer 145 may be formed using a PVD process. The magnetic tunnel junction layer MTL may include the first magnetic layer 151, the tunnel insulating layer 152, and the second magnetic layer 153.

The conductive mask layer ML and the insulating mask pattern 181 may be formed on the upper electrode layer 145. The conductive mask layer ML may be formed by a patterning process using the insulating mask pattern 181 as an etch mask. The conductive mask layer ML may include tungsten and/or titanium nitride. The insulating mask pattern 181 may include at least one of, e.g., silicon oxide, silicon nitride, or silicon oxynitride. The conductive mask layer ML may be formed to cover the cell array region CAR and expose the peripheral circuit region PCR.

The upper electrode layer 145, the magnetic tunnel junction layer MTL, the lower electrode layer 140, and the molding structure SC may be sequentially removed from the peripheral circuit region PCR through an etching process using the conductive mask layer ML as an etch mask. An upper portion of the capping interlayered insulating layer 171 may also be removed in the etching process, and thus, the air gap AG may be opened.

A thermal oxidation process may be performed on a sidewall of the magnetic tunnel junction layer MTL exposed by the etching process. As a result of the oxidation process, the capping oxide layer 173 may be formed on the exposed sidewall of the magnetic tunnel junction layer MTL. The capping oxide layer 173 may protect the magnetic tunnel junction layer MTL against harmful environment in a subsequent process. In certain embodiments, the formation of the capping oxide layer 173 may be omitted.

Figure 22:
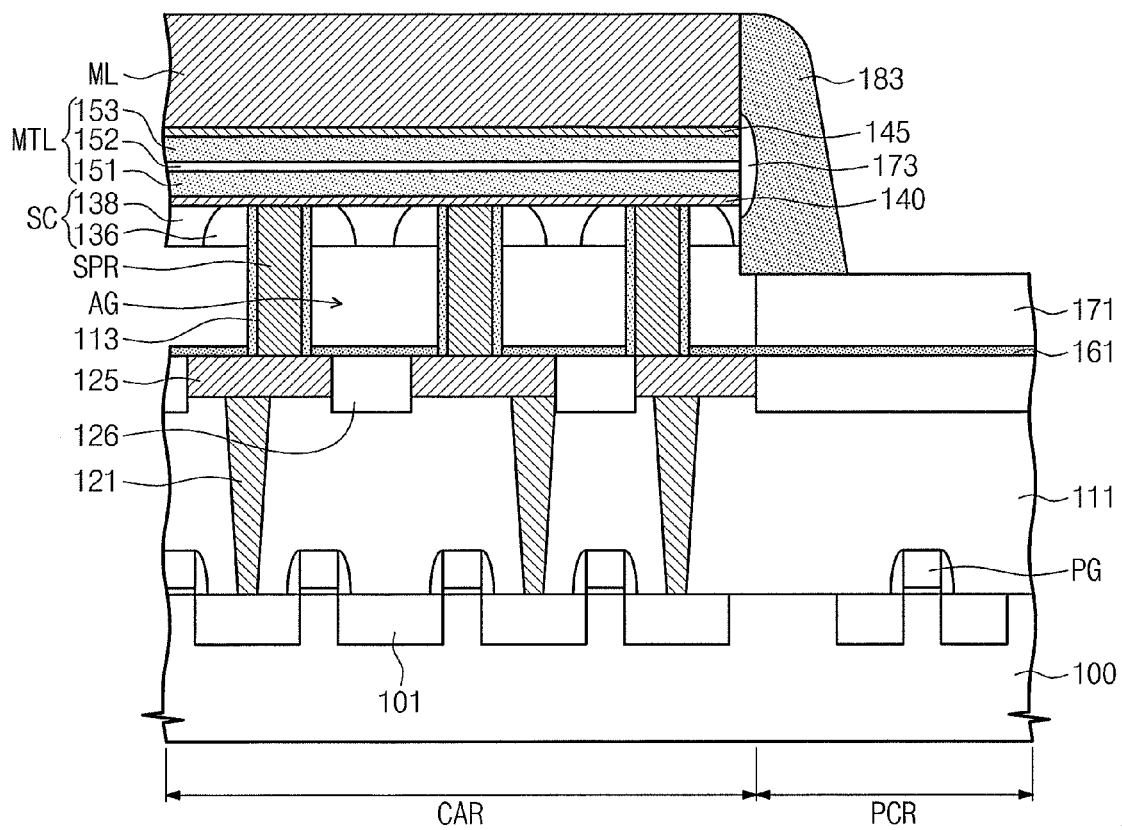

Referring to FIG. 22, the spacer insulating layer 183 may be formed on the sidewall of the magnetic tunnel junction layer MTL to hermetically seal the air gap AG. The spacer insulating layer 183 may be formed to be in contact with the sidewall of the molding structure SC and the top surface of the capping interlayered insulating layer 171. The spacer insulating layer 183 may include a material having an etch selectivity with respect to the molding structure SC. As an example, in the case where the molding structure SC includes silicon oxide, the spacer insulating layer 183 may include silicon nitride.

The subsequent process may be performed using the same method as described with reference to FIGS. 11 through 14.

FIGS. 23 through 26 are sectional views taken along line A-A' of FIG. 5 to illustrate a method of fabricating a magnetic memory device according to still other example embodiments. For concise description, a previously described element may be identified by a similar or identical reference number without repeating an overlapping description thereof.

Figure 23:
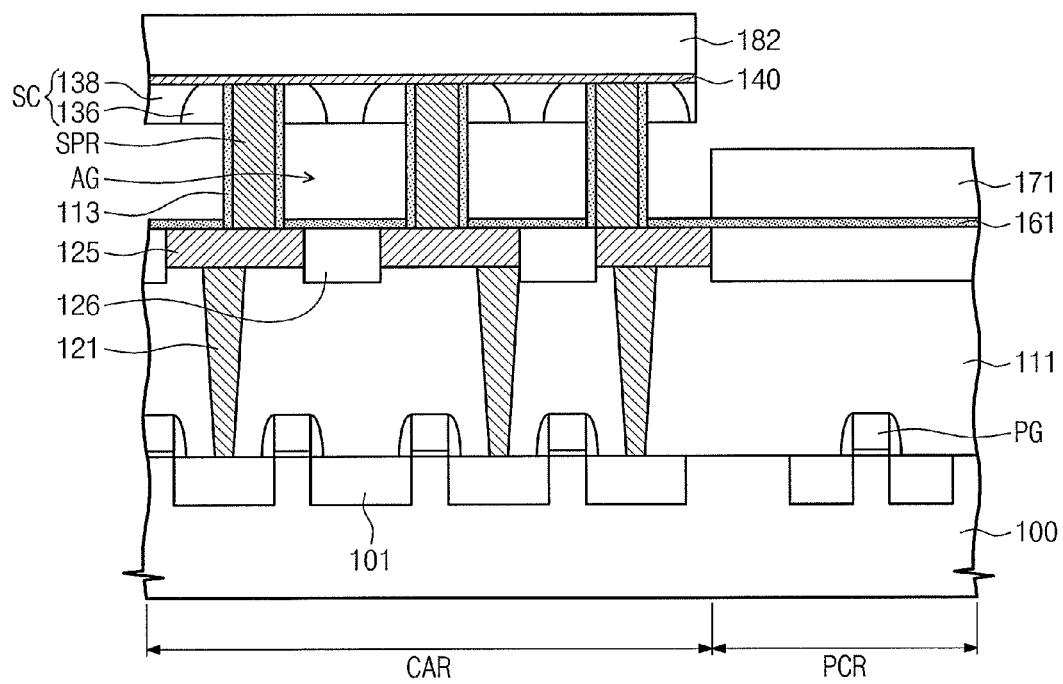
FIGS. 23 through 26 are cross-sectional views along line A-A' of FIG. 5, which illustrate stages in a method of fabricating a magnetic memory device according to still other example embodiments.

Referring to FIG. 23, the lower electrode layer 140 and a mask pattern 182 may be sequentially formed on the structure described with reference to FIG. 20, and then, a patterning process using the mask pattern 182 as an etch mask may be performed to open the air gap AG. The mask pattern 182 may be formed to cover the cell array region CAR and expose the peripheral circuit region PCR. As a result, the lower electrode layer 140 and an upper portion of the capping interlayered insulating layer 171 may be removed from the peripheral circuit region PCR to open the air gap AG.

Figure 24:
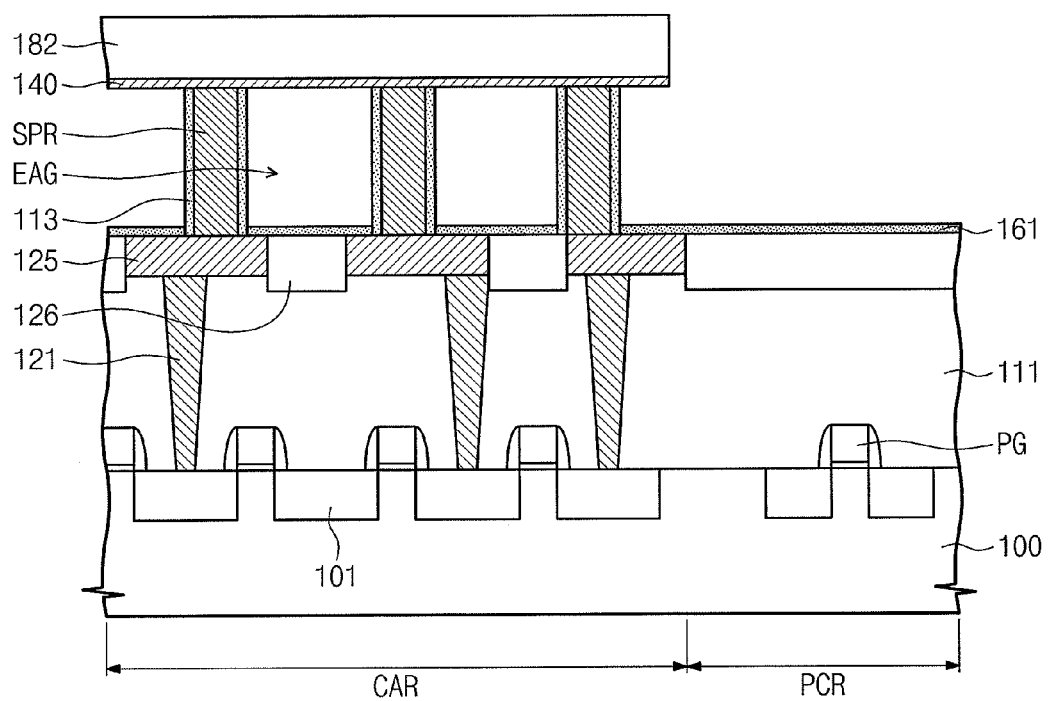

Referring to FIG. 24, the capping interlayered insulating layer 171 and the molding structure SC may be removed to form an expanded air gap EAG. The removal of the capping interlayered insulating layer 171 and the molding structure SC may include a selective etching process. As a result of the selective etching process, the expanded air gap EAG may be formed to expose a bottom surface of the lower electrode layer 140. The pad insulating layer 161 and the capping insulating layer 113 may not be removed in the process of forming the expanded air gap EAG.

Figure 25:
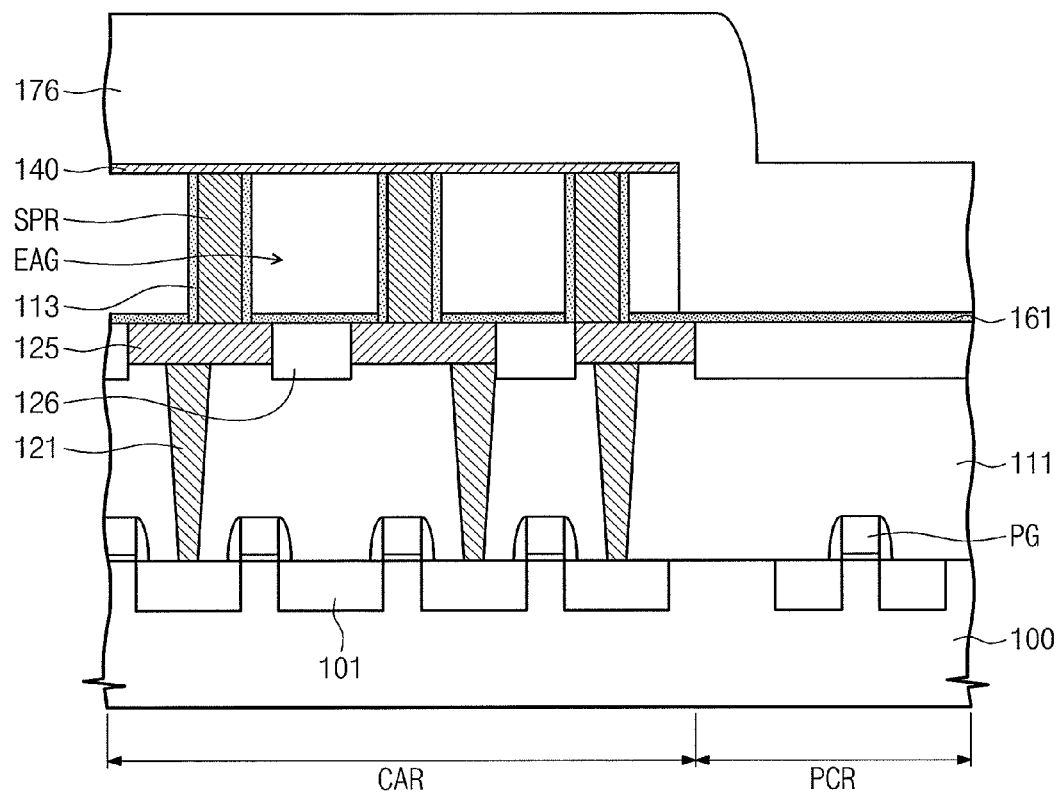

Referring to FIG. 25, the mask pattern 182 may be removed and a fourth interlayered insulating layer 176 may be provided to cover the whole of the structure, from which the mask pattern 182 is removed. The fourth interlayered insulating layer 176 may be formed of a material with a poor step coverage property. As an example, the fourth interlayered insulating layer 176 may be formed using a PE-CVD or PVD process. Accordingly, the fourth interlayered insulating layer 176 may not fill the whole of the expanded air gap EAG.

Figure 26:
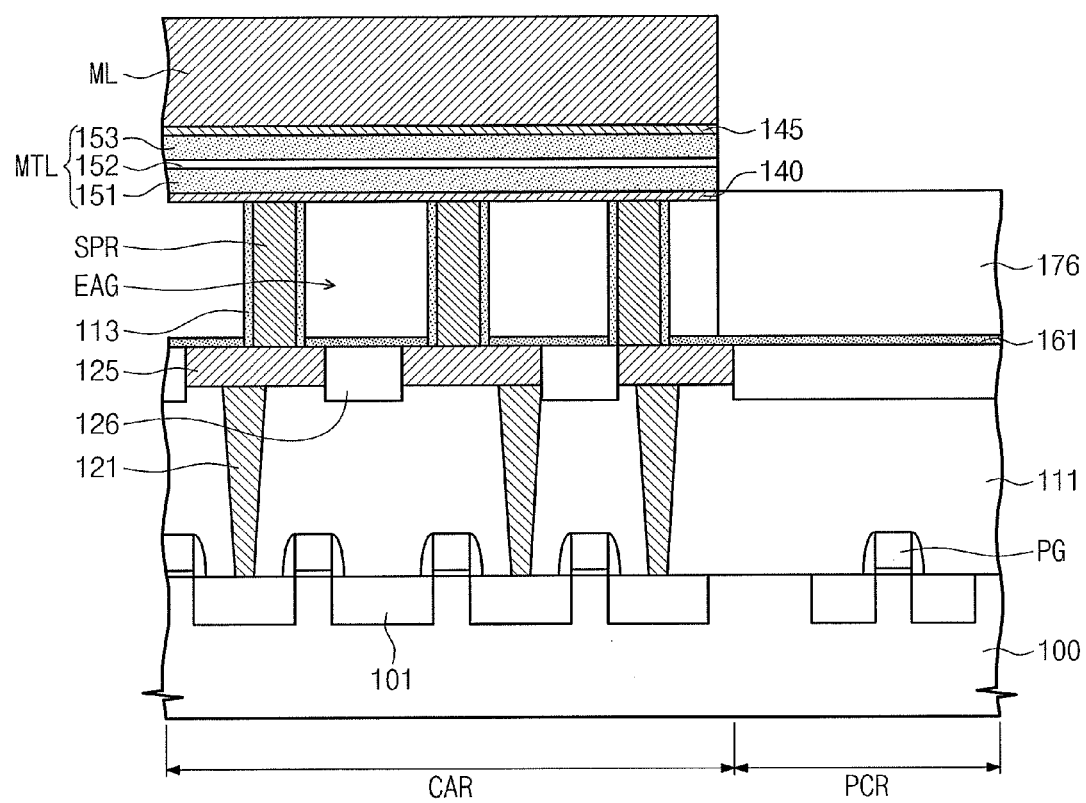

Referring to FIG. 26, a planarization process may be performed on the fourth interlayered insulating layer 176 to expose the top surface of the lower electrode layer 140. The magnetic tunnel junction layer MTL and the upper electrode layer 145 may be sequentially formed on the exposed top surface of the lower electrode layer 140. In other words, according to the present embodiment, the magnetic tunnel junction layer MTL may be formed after removing the molding structure SC of FIG. 23. The upper electrode layer 145 may be formed of at least one of metals, conductive metal nitrides, or doped semiconductor materials. For example, the magnetic tunnel junction layer MTL and the upper electrode layer 145 may be formed using a PVD process. The magnetic tunnel junction layer MTL may include the first magnetic layer 151, the tunnel insulating layer 152, and the second magnetic layer 153.

The conductive mask layer ML may be formed on the upper electrode layer 145. The conductive mask layer ML may include tungsten and/or titanium nitride. The conductive mask layer ML may be formed to cover the cell array region CAR and expose the peripheral circuit region PCR. The upper electrode layer 145, the magnetic tunnel junction layer MTL, and the lower electrode layer 140 may be sequentially removed from the peripheral circuit region PCR through an etching process using the conductive mask layer ML as an etch mask.

The subsequent process may be performed using the same method as described with reference to FIGS. 13 and 14.

FIGS. 27 through 31 are sectional views taken along line A-A' of FIG. 5 to illustrate a method of fabricating a magnetic memory device according to even other example embodiments. For concise description, a previously described element may be identified by a similar or identical reference number without repeating an overlapping description thereof.

Figure 27:
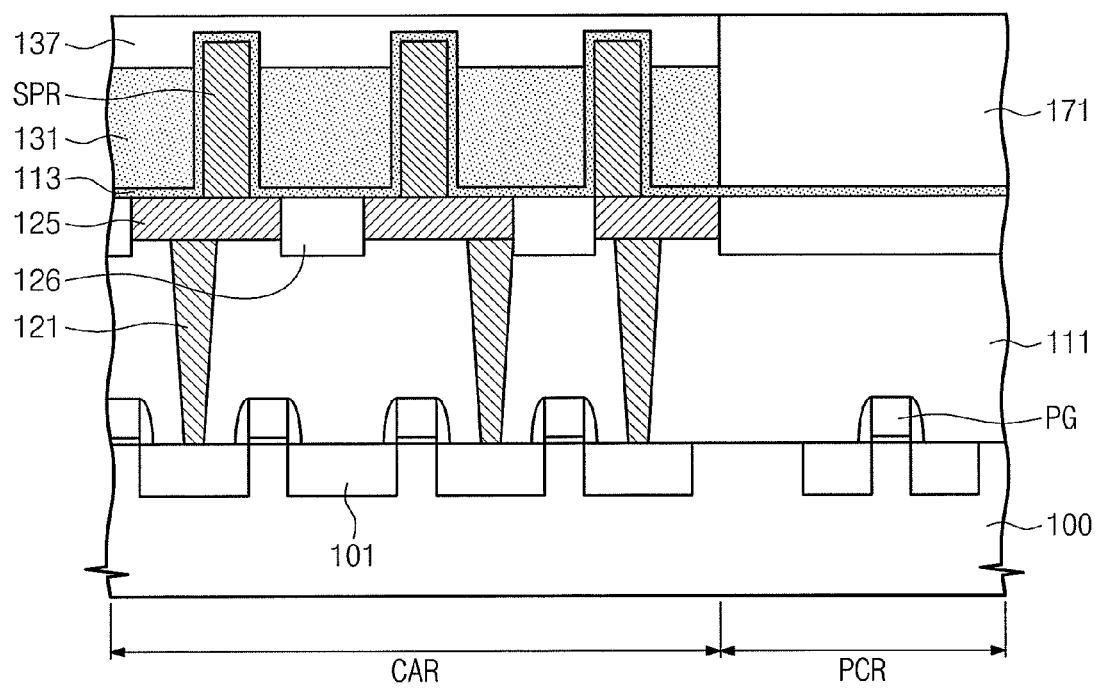
FIGS. 27 through 31 are cross-sectional views along line A-A' of FIG. 5, which illustrate stages in a method of fabricating a magnetic memory device according to even other example embodiments.

Referring to FIG. 27, the sacrificial layer 131 and a first molding layer 137 may be sequentially formed on the structure described with reference to FIG. 7. The sacrificial layer 131 may be formed to have a top surface lower than the top surfaces of the conductive pillars SPR, and at least a portion of the first molding layer 137 may extend between the conductive pillars SPR. The sacrificial layer 131 may be formed of or include, e.g., a silicon organic hybrid (SOH) layer. In other example embodiments, the sacrificial layer 131 may include a material having an etch selectivity with respect to the first molding layer 137. For example, in the case where the sacrificial layer 131 includes silicon oxide, the first molding layer 137 may include silicon nitride. In another example, when the sacrificial layer 131 includes polysilicon, the first molding layer 137 may include silicon oxide or silicon nitride. The sacrificial layer 131 may be formed using a CVD process.

The sacrificial layer 131 and the first molding layer 137 may be locally formed on the cell array region CAR. For example, the sacrificial layer 131 and the first molding layer 137 may be formed to cover the whole of the substrate 100, and then may be removed from the peripheral circuit region PCR to form a recess region. Thereafter, the capping interlayered insulating layer 171 may be formed to fill the recess region. The capping interlayered insulating layer 171 may include, e.g., silicon oxide. A planarization process may be performed on the capping interlayered insulating layer 171 to expose the top surface of the first molding layer 137 on the cell array region CAR.

Figure 28:
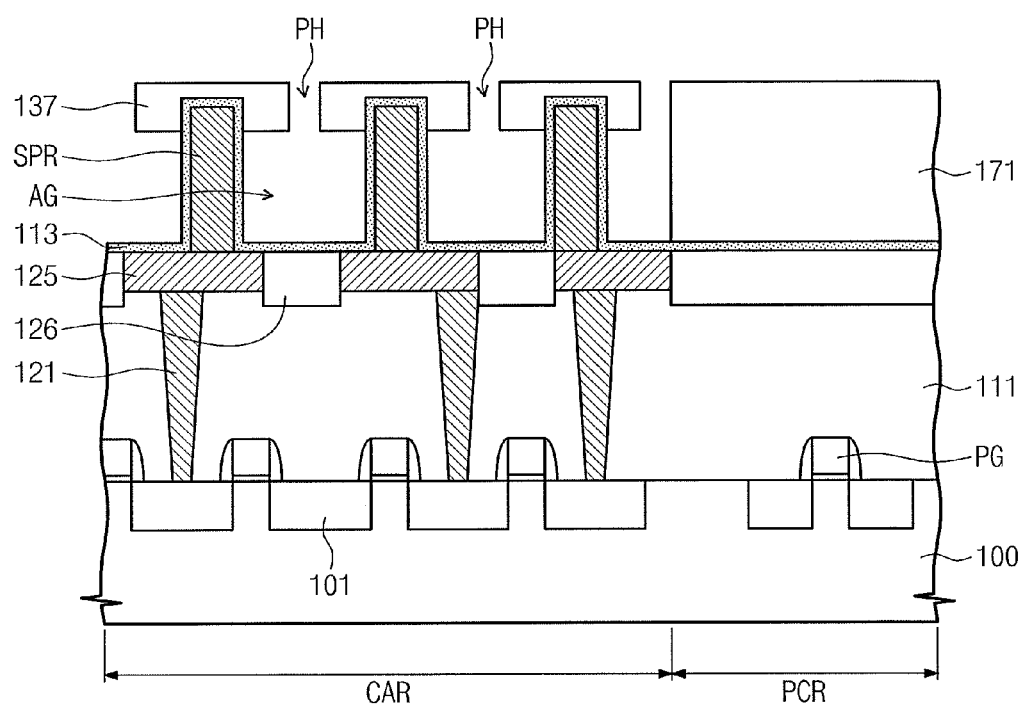

Referring to FIG. 28, penetrating holes PH may be formed to penetrate the first molding layer 137 and expose the sacrificial layer 131. The formation of the penetrating holes PH may include forming a mask pattern on the first molding layer 137 and etching the first molding layer 137 using the mask pattern as an etch mask. When viewed in a plan view, the penetrating holes PH may be formed between every pair of the conductive pillars SPR, but example embodiments are not limited thereto. For example, the penetrating holes PH may be connected to each other to have a mesh-shaped structure or may be locally formed on a specific region.

The sacrificial layer 131 exposed by the penetrating holes PH may be removed to form an air gap AG. The removal of the sacrificial layer 131 may include an ashing process and/or an ultraviolet irradiation process. In the case where the sacrificial layer 131 has an etch selectivity with reference to the first molding layer 137, the removal of the sacrificial layer 131 may include a selective etching process. For example, the first molding layer 137 may not be removed in the process of removing the sacrificial layer 131.

Figure 29:
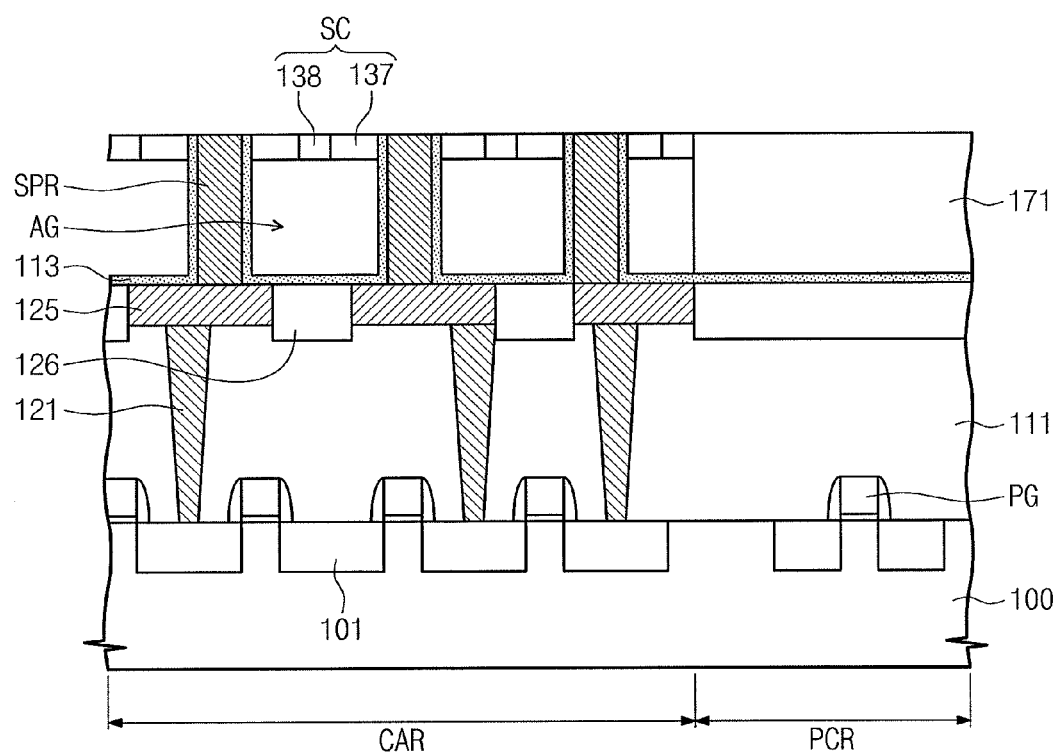

Referring to FIG. 29, the second molding patterns 138 may be formed to fill the penetrating holes PH. The second molding patterns 138 may be formed of, e.g., an insulating layer having a poor step coverage property. The second molding patterns 138 may be formed using a PE-CVD or PVD process. Accordingly, at least a portion of the air gap AG may not be filled with the second molding patterns 138 and may remain as an empty space. The formation of the second molding patterns 138 may include a planarization process to expose the top surfaces of the conductive pillars SPR. As a result, a molding structure SC including the first molding layer 137 and the second molding patterns 138 may be formed, e.g., defined, between adjacent conductive pillars SPR.

Figure 30:
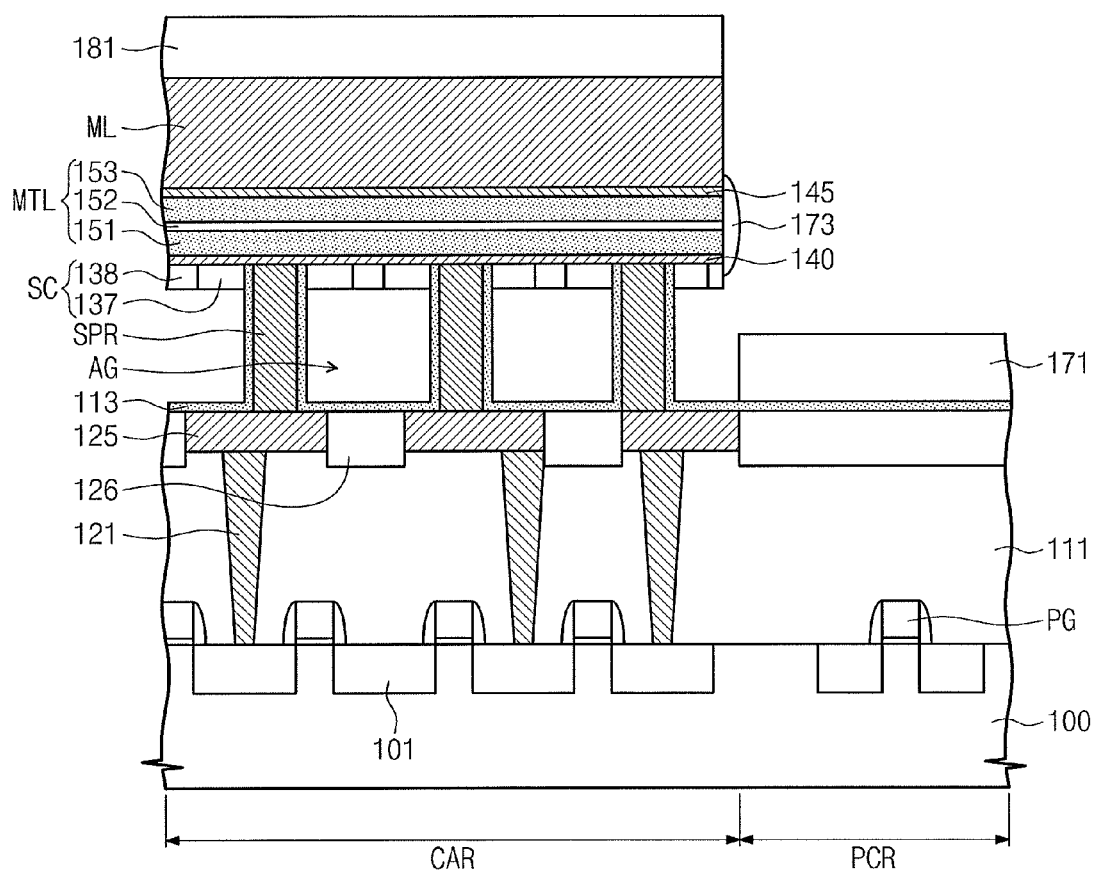

Referring to FIG. 30, the lower electrode layer 140, the magnetic tunnel junction layer MTL, and the upper electrode layer 145 may be sequentially formed on the structure provided with the molding structure SC. The lower and upper electrode layers 140 and 145 may be formed of or include at least one of metals, conductive metal nitrides, or doped semiconductor materials. In certain embodiments, at least one of the lower electrode layer 140, the magnetic tunnel junction layer MTL, or the upper electrode layer 145 may be formed using a PVD process. The magnetic tunnel junction layer MTL may include the first magnetic layer 151, the tunnel insulating layer 152, and the second magnetic layer 153.

The conductive mask layer ML and the insulating mask pattern 181 may be formed on the upper electrode layer 145. The conductive mask layer ML may be formed by a patterning process using the insulating mask pattern 181 as an etch mask. The conductive mask layer ML may include tungsten and/or titanium nitride. The insulating mask pattern 181 may include at least one of silicon oxide, silicon nitride, or silicon oxynitride. The conductive mask layer ML may be formed to cover the cell array region CAR and expose the peripheral circuit region PCR.

The upper electrode layer 145, the magnetic tunnel junction layer MTL, and the lower electrode layer 140 may be sequentially removed from the peripheral circuit region PCR through an etching process using the conductive mask layer ML as an etch mask. In the etching process, an upper portion of the capping interlayered insulating layer 171 of the peripheral circuit region PCR may also be removed to open the air gap AG. A thermal oxidation process may be performed on a sidewall of the magnetic tunnel junction layer MTL exposed by the etching process. As a result of the oxidation process, the capping oxide layer 173 may be formed on the exposed sidewall of the magnetic tunnel junction layer MTL. The capping oxide layer 173 may protect the magnetic tunnel junction layer MTL against harmful environment in a subsequent process. In certain embodiments, the formation of the capping oxide layer 173 may be omitted.

Figure 31:
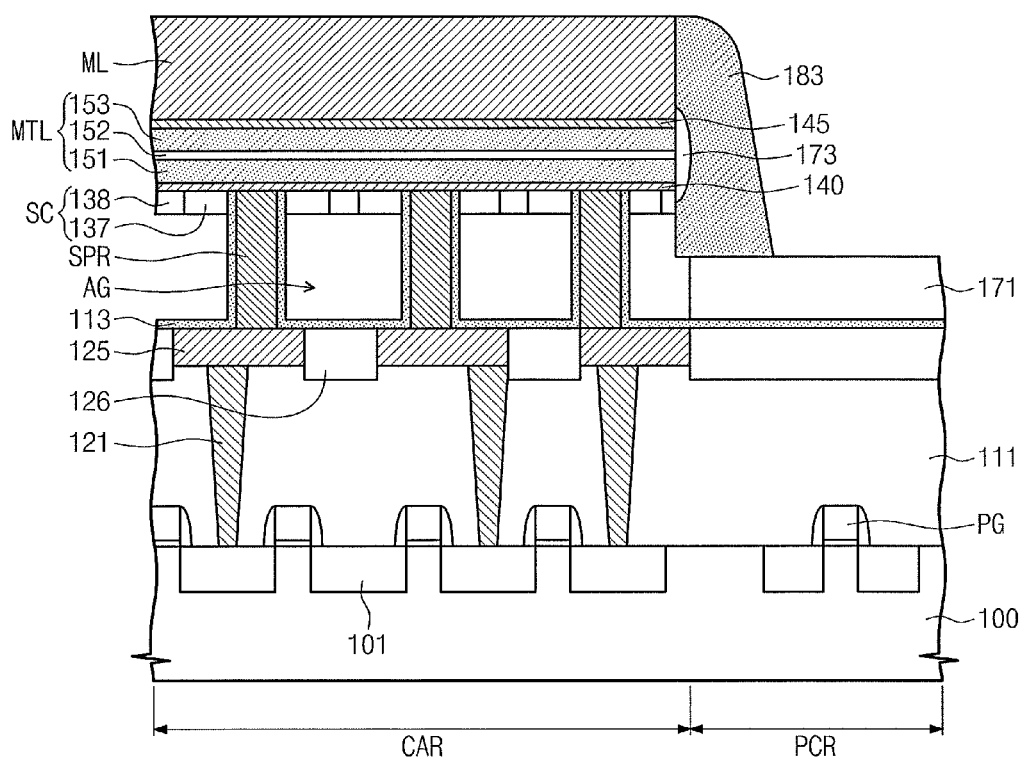

Referring to FIG. 31, the spacer insulating layer 183 may be formed on the sidewall of the magnetic tunnel junction layer MTL to hermetically seal the air gap AG. The spacer insulating layer 183 may be formed to be in contact with a sidewall of the molding structure SC and a top surface of the capping interlayered insulating layer 171. The spacer insulating layer 183 may include a material having an etch selectivity with respect to the molding structure SC. As an example, in the case where the molding structure SC includes silicon oxide, the spacer insulating layer 183 may include silicon nitride. The formation of the spacer insulating layer 183 may include forming an insulating layer to cover the whole of the substrate 100 and performing a dry etching process on the insulating layer.

The subsequent process may be performed using the same method as described with reference to FIGS. 11 through 14.

Figure 32:
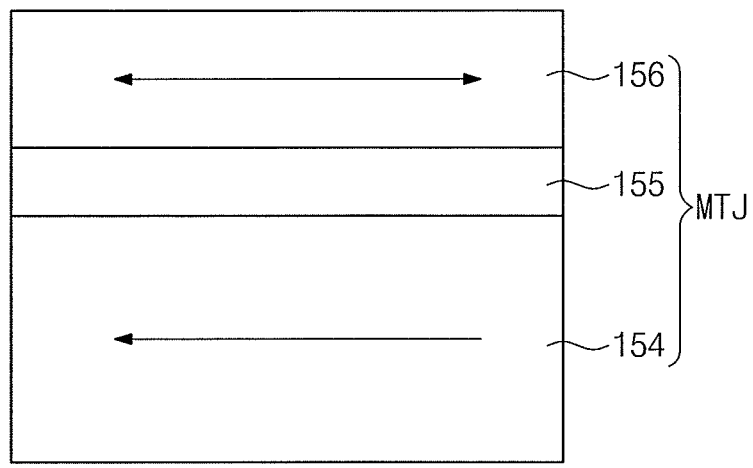
FIG. 32 illustrates a schematic diagram of a magnetic tunnel junction structure according to example embodiments.

FIG. 32 is a schematic diagram illustrating a magnetic tunnel junction structure according to example embodiments. A magnetic tunnel junction structure MTJ according to the present embodiment may include the first magnetic pattern 154, the tunnel insulating pattern 155, and the second magnetic pattern 156. One of the first and second magnetic patterns 154 and 156 may serve as a free layer of the magnetic tunnel junction MTJ, and the other may serve as a fixed layer of the magnetic tunnel junction MTJ. For simplicity, the description that follows will refer to an example of the present embodiment in which the first and second magnetic patterns 154 and 156 are used as fixed and free layers, respectively, but in other embodiments, the first and second magnetic patterns 154 and 156 may be used as free and fixed layers, respectively. The magnetic tunnel junction structure MTJ may have an electric resistance varying depending on magnetization directions of the free and fixed layers. For example, the electric resistance of the magnetic tunnel junction structure MTJ may be much higher when magnetization directions of the free and fixed layers are anti-parallel than when they are parallel. As a result, the electric resistance of the magnetic tunnel junction structure MTJ can be controlled by changing a magnetization direction of the free layer, and this may be used as data storing mechanism in the magnetic memory device according to example embodiments.

In example embodiments, the first and second magnetic patterns 154 and 156 may be configured to have an in-plane magnetization structure. For example, each of the first and second magnetic patterns 154 and 156 may include at least one magnetic layer, whose magnetization direction is substantially parallel to a top surface of the tunnel insulating pattern 155. In the present embodiment, the first magnetic pattern 154 may include two layers, one of which includes an antiferromagnetic material, and the other of which includes a ferromagnetic material. The layer including the antiferromagnetic material may include at least one of, e.g., PtMn, IrMn, MnO, MnS, MnTe, $MnF_2$, $FeCl_2$, FeO, $CoCl_2$, CoO, $NiCl_2$, NiO, or Cr. In certain embodiments, the layer including the antiferromagnetic material may include at least one of precious metals, e.g., ruthenium (Ru), rhodium (Rh), palladium (Pd), osmium (Os), iridium (Ir), platinum (Pt), gold (Au), or silver (Ag). The layer including the ferromagnetic material may include at least one of, e.g., CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern 156 may be configured to have a variable or switchable magnetization direction. The second magnetic pattern 156 may include a ferromagnetic material. For example, the second magnetic pattern 156 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$.

The second magnetic pattern 156 may include a plurality of layers. For example, the second magnetic pattern 156 may include a plurality of ferromagnetic layers and at least one non-magnetic layer interposed between the ferromagnetic layers. In this case, the ferromagnetic layers and the non-magnetic layer may constitute a synthetic antiferromagnetic layer. The synthetic antiferromagnetic layer may make it possible to reduce a critical current density of the magnetic memory device and improve a thermal stability of the magnetic memory device.

The tunnel insulating pattern 155 may include at least one of, e.g., magnesium oxide, titanium oxide, aluminum oxide, magnesium-zinc oxide, magnesium-boron oxide, titanium nitride, or vanadium nitride. For example, the tunnel insulating pattern 155 may be a single layer of magnesium oxide (MgO). In another example, the tunnel insulating pattern 155 may include a plurality of layers. The tunnel insulating pattern 155 may be formed by a chemical vapor deposition process.

Figure 33:
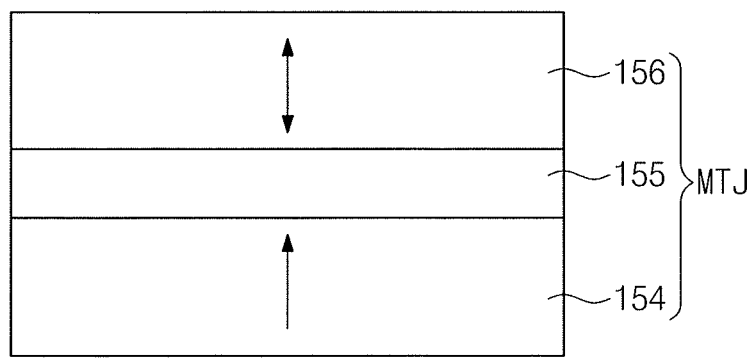
FIG. 33 illustrates a schematic diagram of a magnetic tunnel junction structure according to other example embodiments.

FIG. 33 is a schematic diagram illustrating a magnetic tunnel junction structure according to other example embodiments. In the present embodiment, the first and second magnetic patterns 154 and 156 may be configured to have a perpendicular magnetization structure. For example, each of the first and second magnetic patterns 154 and 156 may include at least one magnetic layer, whose magnetization direction is substantially normal to the top surface of the tunnel insulating pattern 155. In the present embodiment, the first and second magnetic patterns 154 and 156 may include at least one of materials with an $L_{10}$ crystal structure, materials having the hexagonal closed packed structure, or amorphous rare-earth transition metal (RE-TM) alloys. For example, the first and second magnetic patterns 154 and 156 may include at least one of materials having an $L_{10}$ structure, such as $Fe_{50}Pt_{50}$, $Fe_{50}Pd_{50}$, $Co_{50}Pt_{50}$, $Co_{50}Pd_{50}$, and $Fe_{50}Ni_{50}$. In other embodiments, the first and second magnetic patterns 154 and 156 may include at least one of cobalt-platinum (CoPt) disordered HCP alloys having a platinum content of 10 to 45 at. % or $Co_3Pt$ ordered HCP alloys. In still other embodiments, the first and second magnetic patterns 154 and 156 may include at least one of the amorphous RE-TM alloys containing at least one of iron (Fe), cobalt (Co), or nickel (Ni) and at least one of rare-earth metals such as terbium (Tb), dysprosium (Dy), and gadolinium (Gd).

At least one of the first and second magnetic patterns 154 and 156 may include a material exhibiting an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate.

In example embodiments, the first and second magnetic patterns 154 and 156 may include at least one of cobalt (Co), iron (Fe), or nickel (Ni). The first and second magnetic patterns 154 and 156 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, the first and second magnetic patterns 154 and 156 may include a layer of CoFe or NiFe, in which boron (B) is added. Furthermore, to lower saturation magnetization, at least one of the first and second magnetic patterns 154 and 156 may further include at least one of titanium (Ti), aluminum (Al), magnesium (Mg), tantalum (Ta), or silicon (Si). The first and second magnetic patterns 154 and 156 may be formed by a sputtering or PECVD process.

The magnetic memory devices disclosed above may be encapsulated using various and diverse packaging techniques. For example, the magnetic memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which the magnetic memory device according to one of the above embodiments is mounted may further include at least one semiconductor device (e.g., a controller and/or a logic device) that controls the magnetic memory device.

Figure 34:
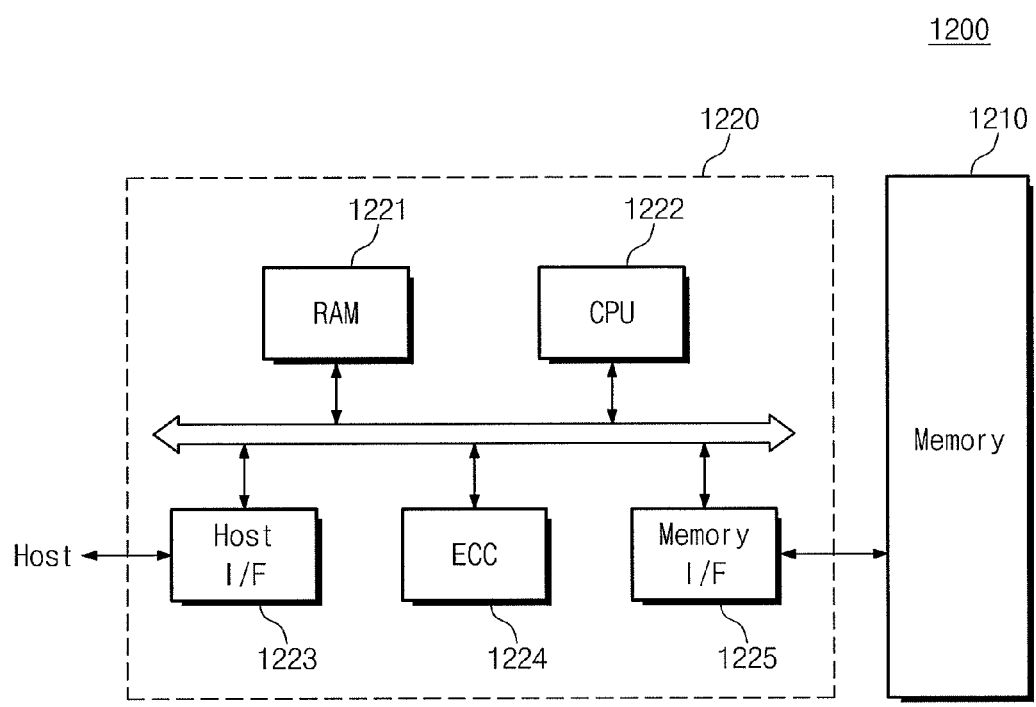
FIG. 34 illustrates a schematic block diagram of an example of a memory card including a magnetic memory device according to example embodiments.

FIG. 34 is a schematic block diagram illustrating an example of memory cards including a magnetic memory device according to example embodiments.

Referring to FIG. 34, a memory card 1200 according to example embodiments may include a memory device 1210. The memory device 1210 may include at least one of the magnetic memory devices according to the previously described embodiments. In certain embodiments, the memory device 1210 may further include other semiconductor memory device, e.g., such as a dynamic random access memory (DRAM) device or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface (I/F) unit 1223 and a memory interface (I/F) unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

Figure 35:
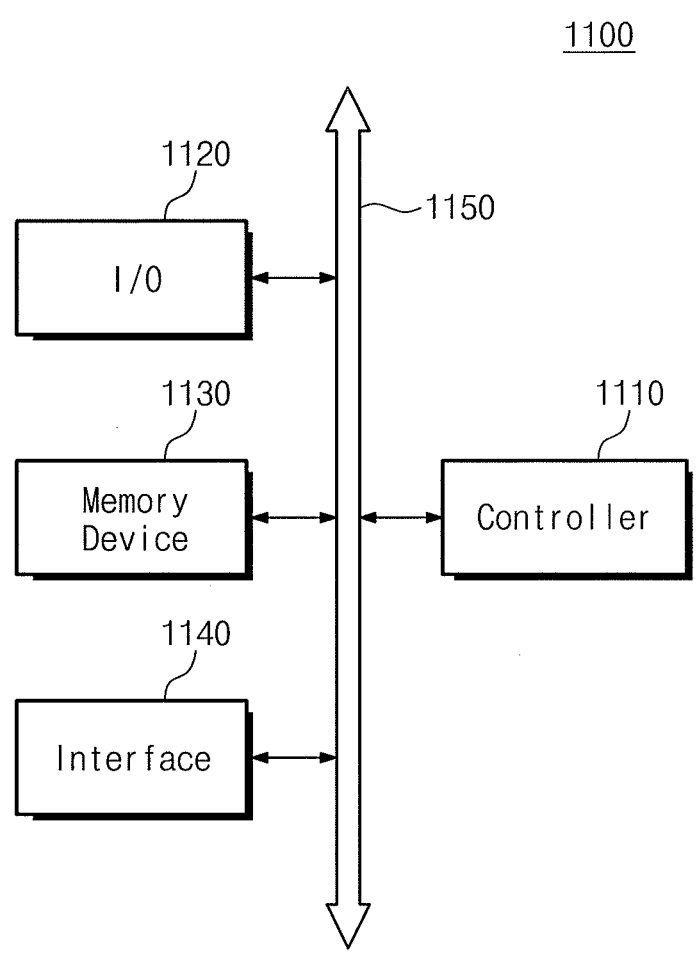
FIG. 35 illustrates a schematic block diagram of an example of an electronic system including a magnetic memory device according to example embodiments.

FIG. 35 is a schematic block diagram illustrating an example of electronic systems including a magnetic memory device according to example embodiments.

Referring to FIG. 35, an electronic system 1100 according to example embodiments may include a controller 1110, an input/output (I/O) unit 1120, a memory device 1130, an interface unit 1140, and a bus 1150. At least two of the controller 1110, the I/O unit 1120, the memory device 1130, and the interface unit 1140 may communicate with each other through the bus 1150. The bus 1150 may correspond to a path through which electrical signals are transmitted.

The controller 1110 may include at least one of, e.g., a microprocessor, a digital signal processor, a microcontroller, or other logic device. The other logic device may have a similar function to any one of the microprocessor, the digital signal processor and the microcontroller. The I/O unit 1120 may include, e.g., a keypad, a keyboard or a display unit. The memory device 1130 may store data and/or commands. The memory device 1130 may include at least one of the magnetic memory devices according to the previously described embodiments. In certain embodiments, the memory device 1130 may further include other semiconductor memory device, e.g., a DRAM or SRAM device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM or SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

According to example embodiments, an expanded air gap may be formed in advance before patterning a conductive layer, and thus, re-deposition of etch residues generated during the patterning process can be suppressed. Accordingly, it is possible to prevent an electric short caused by the re-deposition of the etch residues. Further, not only the sacrificial layer but also the molding structure may be removed in advance before the patterning process, and thus, the expanded air gap can be easily opened by the patterning process. In addition, there is no need to perform an additional etching process for removing a re-deposited etch residue layer after the patterning process, and this makes it possible to reduce consumption of a conductive mask patterns serving as an etch mask in the patterning process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
    forming conductive pillars on a substrate;
    sequentially forming a sacrificial layer and a molding structure between the conductive pillars;
    forming a conductive layer on the molding structure, such that the conductive layer is connected to the conductive pillars;
    removing the sacrificial layer to form an air gap;
    removing the molding structure to form an expanded air gap; and
    patterning the conductive layer to open the expanded air gap.

2. The method as claimed in claim 1, wherein:
    the substrate includes a cell array region and a peripheral circuit region, and
    removing the molding structure is performed through a pathway that is located between the cell array region and the peripheral circuit region.

3. The method as claimed in claim 2, wherein the cell array region has first to fourth edges adjacent to the peripheral circuit region, and the pathway is formed to cross at least one of the first to fourth edges.

4. The method as claimed in claim 2, wherein removing the molding structure is performed after the forming of the conductive layer.

5. The method as claimed in claim 2, wherein removing the molding structure includes:
    forming a mask pattern to cover the cell array region and expose the peripheral circuit region;
    performing a patterning process using the mask pattern as an etch mask to expose a sidewall of the molding structure, and
    etching the molding structure exposed by the patterning process.

6. The method as claimed in claim 5, wherein:
    removing the sacrificial layer is performed after forming of the conductive layer and after the patterning process, the patterning process being performed to expose the sacrificial layer, and
    etching the molding structure is performed after removing the sacrificial layer.

7. The method as claimed in claim 6, wherein:
    the patterning process is performed to expose a sidewall of the conductive layer, and
    the method further comprises forming a spacer insulating layer on the sidewall of the conductive layer exposed by the patterning process to seal the air gap, after removing the sacrificial layer.

8. The method as claimed in claim 6, wherein:
    the patterning process is performed to expose a sidewall of the conductive layer, and
    the method further comprises performing a thermal oxidation process to form a capping oxide layer on the exposed sidewall of the conductive layer, before removing the sacrificial layer.

9. The method as claimed in claim 5, wherein:
    removing the sacrificial layer is performed before forming the conductive layer,
    removing the molding structure is performed after removing the sacrificial layer, and
    the patterning process is performed to open the air gap.

10. The method as claimed in claim 9, wherein:
    forming the molding structure includes forming first molding patterns on upper sidewalls of the conductive pillars, and
    the sacrificial layer is removed through gap regions between the first molding patterns.

11. The method as claimed in claim 10, wherein the first molding patterns are formed using a spacer process to have a ring-shaped structure enclosing the upper sidewall of the conductive pillar, when viewed in a plan view.

12. The method as claimed in claim 10, wherein the first molding patterns are formed to have penetrating holes exposing the sacrificial layer.

13. The method as claimed in claim 1, wherein:
the conductive layer includes a lower electrode layer and a magnetic tunnel junction layer on the lower electrode layer,
the lower electrode layer is formed before removing the molding structure, and
the magnetic tunnel junction layer is formed after removing the molding structure.

14. A method of fabricating a magnetic memory device, the method comprising:
preparing a substrate with a cell array region and a peripheral circuit region;
forming conductive pillars on the cell array region;
sequentially forming a sacrificial layer and a molding structure on the conductive pillars;
forming a conductive layer on the molding structure;
removing the sacrificial layer to form an air gap between the conductive pillars;
performing a first patterning process using a mask pattern covering the cell array region and exposing the peripheral circuit region to expose the molding structure;
removing the molding structure exposed through a boundary between the cell array region and the peripheral circuit region to form an expanded air gap; and
performing a second patterning process on the conductive layer to open the expanded air gap.

15. The method as claimed in claim 14, wherein:
the first patterning process is performed to expose the sacrificial layer, and
removing the sacrificial layer is performed through a pathway that is located between the cell array region and the peripheral circuit region, after the first patterning process.

16. The method as claimed in claim 15, wherein:
the first patterning process is performed to expose a sidewall of the conductive layer, and
the method further comprises performing a thermal oxidation process to form a capping oxide layer on the exposed sidewall of the conductive layer.

17. The method as claimed in claim 15, wherein:
the first patterning process is performed to expose a sidewall of the conductive layer, and
the method further comprises forming a spacer insulating layer to seal the air gap, before removing the molding structure.

18. The method as claimed in claim 14, wherein:
removing the sacrificial layer is performed before forming the conductive layer,
removing the molding structure is performed after removing the sacrificial layer, and
the first patterning process is performed to open the air gap.

19. The method as claimed in claim 14, wherein:
forming the conductive layer includes sequentially forming a lower electrode layer and a magnetic tunnel junction layer on the molding structure,
the lower electrode layer is formed before removing the molding structure, and
the magnetic tunnel junction layer is formed after removing the molding structure.

20. A method of fabricating a semiconductor device, the method comprising:
forming conductive pillars on a substrate;
sequentially forming a sacrificial layer and a molding structure between the conductive pillars;
forming a conductive layer on the molding structure, such that the conductive layer is connected to the conductive pillars;
removing the sacrificial layer, such that an air gap is formed between adjacent conductive pillars;
removing the molding structure, such that an expanded air gap is formed between the adjacent conductive pillars; and
patterning the conductive layer to form conductive patterns on respective conductive pillars, such that a space between the conductive patterns is in fluid communication with the expanded air gap.

* * * * *